United States Patent [19]
Akiyama

[11] Patent Number: 5,994,189
[45] Date of Patent: Nov. 30, 1999

[54] HIGH WITHSTAND VOLTAGE SEMICONDUCTOR DEVICE AND MANUFACTURING METHOD THEREOF

[75] Inventor: Hajime Akiyama, Hyogo, Japan

[73] Assignee: Mitsubishi Denki Kabushiki Kaisha, Tokyo, Japan

[21] Appl. No.: 09/127,806

[22] Filed: Aug. 3, 1998

Related U.S. Application Data

[62] Division of application No. 08/607,033, Feb. 26, 1996, Pat. No. 5,804,864.

[30] Foreign Application Priority Data

Aug. 22, 1995 [JP] Japan ................................. 7-213523

[51] Int. Cl.$^6$ ............................. H01L 29/72; H01L 29/06
[52] U.S. Cl. ........................ 438/268; 438/408; 257/489; 257/494
[58] Field of Search ................................. 438/268, 408; 257/408, 489, 494

[56] References Cited

U.S. PATENT DOCUMENTS

| | | |
|---|---|---|
| 4,300,150 | 11/1981 | Colak . |
| 5,105,243 | 4/1992 | Nakagawa et al. . |
| 5,113,237 | 5/1992 | Stengl . |
| 5,132,753 | 7/1992 | Chang et al. ........................ 357/23.4 |
| 5,241,210 | 8/1993 | Nakagawa et al. . |
| 5,349,225 | 9/1994 | Redwine et al. ...................... 257/336 |
| 5,498,892 | 3/1996 | Walker et al. ........................ 257/336 |

FOREIGN PATENT DOCUMENTS

| | | |
|---|---|---|
| 0 124 139 A2 | 11/1984 | European Pat. Off. . |
| 0 360 036 A2 | 3/1990 | European Pat. Off. . |
| 0 526 037 A1 | 2/1993 | European Pat. Off. . |
| 0 615 291 A1 | 9/1994 | European Pat. Off. . |
| 2 173 037 | 10/1986 | United Kingdom . |

OTHER PUBLICATIONS

"Realization of High Breakdown Voltage (>700V) In Thin SOI Devices", by S. Merchant et al., *IEEE*, pp. 31–35, Dec. 1991.
"Electronic Device for Increasing Withstand Voltage of SOI Separation Structure", by Akiyama et al., Semiconductor Electric Power Convention Joint Research Society, pp. 1–6, Dec. 1992.
"High Voltage Device Structures for Trench Isolated SOI Power ICs", by Yasuhara et al., A Material of the Research Society of the Institute of Electronics, pp. 69–74, Dec. 1992.
"A Versatile 700–1200–V IC Process for Analog and Switching Applications", by Adriaan W. Ludikhuize, *IEEE Transactions on Electron Devices* vol. 38, No. 7, Jul. 1991.
"Over 1000V n–ch LDMOSFET and p–ch LIGBT with JI RESURF Structure and Multiple Floating Field Plate", by Tomohide Terashima et al., *ISPS–D*, Dec. 1995.
"Structure of 600V IC and A New Voltage Sensing Device", by T. Terashima et al., *IEEE*, pp. 224–229, Dec. 1993.
*Modern Power Devices* by B.J. Baligh, pp. 92–99, Dec. 1987.

*Primary Examiner*—Charles Bowers
*Assistant Examiner*—David S Blum
*Attorney, Agent, or Firm*—McDermott, Will & Emery

[57] ABSTRACT

An n$^-$ layer is formed on a main surface of a p-type semiconductor substrate. A p$^-$ diffusion region is formed at a surface of n$^-$ layer. A p diffusion region is formed contiguous to one end of p$^-$ diffusion region. A plurality of p diffusion regions containing p-type impurity the concentration of which is higher than that of p$^-$ diffusion region are formed in p$^-$ diffusion region. A p diffusion region is formed such that it is spaced apart from p$^-$ diffusion region. A gate electrode is formed on a surface of n$^-$ layer positioned between p diffusion region and p$^-$ diffusion region with an oxide film interposed. A drain electrode is formed in contact with a surface of p diffusion region. Furthermore, an n diffusion region is formed adjacent to p diffusion region, and a source electrode is formed in contact with both a surface of n diffusion region and a surface p diffusion region.

1 Claim, 29 Drawing Sheets

HIGH WITHSTAND VOLTAGE SEMICONDUCTOR DEVICE AND MANUFACTURING METHOD THEREOF

This application is a divisional of application Ser. No. 08/607,033 filed Feb. 26, 1996 now U.S. Pat. No. 5,804,864.

BACKGROUND OF THE INVENTION

1. Field of the Invention

The present invention relates to a high withstand voltage semiconductor device and a method for manufacturing the same, and particularly to a high withstand voltage semiconductor device in which a state in which current conducts and a state in which current is cut off are implemented by voltage of a control electrode.

2. Description of the Background Art

Hereinafter, with reference to FIGS. 40–55, the structure and operation of a conventional high withstand voltage semiconductor device will be described. FIG. 40 is a partial cross sectional view of a first example of the conventional high withstand voltage semiconductor device.

Referring to FIG. 40, an $n^-$ layer 2 is formed on a main surface of a p-type semiconductor substrate 1. An $n^+$ buried diffusion region 8 is formed at a boundary portion of $n^-$ layer 2 and p-type semiconductor substrate 1. Furthermore, a p diffusion region 7 is formed such that it penetrates $n^-$ layer 2 in the direction of the depth to reach a main surface of p-type semiconductor substrate 1. A p-channel MOS transistor 14 is formed at a surface of $n^-$ layer 2. P-channel MOS transistor 14 consists of a $p^-$ diffusion region 5, a $p^+$ diffusion region 3 and a gate electrode (control electrode) 9.

An $n^+$ diffusion region 4 is formed adjacent to $p^+$ diffusion region 3. Furthermore, an n diffusion region 4a is formed such that it surrounds $p^+$ diffusion region 3 and $n^+$ diffusion region 4. A source electrode 11 is formed such that it contacts both $n^+$ diffusion region 4 and $p^+$ diffusion region 3. Source electrode 11 extends on gate electrode 9 and $p^-$ diffusion region 5 with an oxide film 10 interposed. A $p^+$ diffusion region 6 is formed contiguous to one end of $p^-$ diffusion region 5. A drain electrode 12 is formed on $p^+$ diffusion region 6 surface. Furthermore, a substrate electrode (back-surface electrode) 13 is formed on a back surface of p-type semiconductor substrate 1.

Referring now to FIGS. 41–43, operation of the high withstand voltage semiconductor device shown in FIG. 40 will be described. Referring firstly to FIGS. 41 and 42, off-operation of the device will be described. FIGS. 41 and 42 show in steps a state of a depletion layer in the high withstand voltage semiconductor device shown in FIG. 40 at the time of off-operation.

Referring firstly to FIGS. 41 and 42, electric potentials of drain electrode 12 and substrate electrode 13 are adapted to be 0V and a positive electric potential (+Vcc) is applied to gate electrode 9 and source electrode 11. This causes a depletion layer to widen mainly from a pn junction B which is an interface of $n^-$ layer 2 and p-type semiconductor substrate 1, a pn junction A which is an interface of $n^-$ layer 2 and p diffusion region 7, and a pn junction C which is an interface of $n^-$ layer 2 and $p^-$ diffusion region 5.

At this point, a depletion layer extending from pn junction A normally widens more easily due to the influence of a depletion layer extending from pn junction B. Accordingly, the electric field in the vicinity of pn junction A is maintained to a relatively small value. This effect is realized by optimizing concentration of p-type semiconductor substrate 1, n-type impurity concentration contained in $n^-$ layer 2 and the thickness of $n^-$ layer 2, and is generally referred to as RESURF (REduced SURface Field) effect.

On the other hand, a portion of the depletion layer extending from pn junction C widens towards $n^-$ layer 2 and at the same time makes $p^-$ diffusion region 5 depleted, since $p^-$ diffusion region 5 is a low concentration region. Gate electrode 9 and source electrode 11 formed overlapped above $p^-$ diffusion region 5 form a two-stage field plate. This promotes depletion of $p^-$ diffusion region 5 and relaxes an electric field of pn junction C in the vicinity of gate electrode 9.

If the conditions of each element are optimized, a higher positive electric potential can be applied. Eventually, the withstand voltage is determined by junction of $n^+$ buried diffusion region 8 and p-type semiconductor substrate 1. At that time, $n^-$ layer 2 and $p^-$ diffusion region 5 have almost been depleted. Thus, the off-state can be maintained.

Referring now to FIG. 43, the on-operation will be described. FIG. 43 shows an on-state of the conventional high withstand voltage semiconductor device shown in FIG. 40. Referring to FIG. 43, a potential of gate electrode 9 is lowered relative to that of source electrode 11. This inverts that surface of $n^-$ layer 2 directly under gate electrode 9 to p-type. This allows a hole current to flow from $p^+$ diffusion region 3 to $p^+$ diffusion region 6 via $p^-$ diffusion region 5 as shown by the arrows in FIG. 43. This implements the on-state. Most of the resistance of the device in the on-state comes from a resistance value of $p^-$ diffusion region 5. Therefore, it is effective to lower the resistance of $p^-$ diffusion region 5 in order to reduce the resistance of the device in the on-state. However, in order to ensure a high withstand voltage, $p^-$ diffusion region 5 is required to be nearly depleted in the off-state. Accordingly, there is an upper limit (optimal value) existing naturally in p-type impurity concentration contained in $p^-$ diffusion region 5.

Referring now to FIGS. 44–47, a second example of the conventional high withstand voltage semiconductor device will be described. FIG. 44 is a partial cross sectional view of the second example of the conventional high withstand voltage semiconductor device. Referring to FIG. 44, it differs from the first example of the high withstand voltage semiconductor device shown in FIG. 40 in that an $n^+$ type diffusion 15 is formed within $p^+$ diffusion region 6. Other than that structure, the device is the same as the high withstand voltage semiconductor device shown in FIG. 40.

Referring now to FIGS. 45–47, operation of the high withstand voltage semiconductor device shown in FIG. 44 will be described. FIGS. 45 and 46 show in steps a state of depletion layer in the high withstand voltage semiconductor device shown in FIG. 44 at the time of off-operation. The description of the off-operation will not be repeated here since it is the same as the description in the case of the first example of the high withstand voltage semiconductor device shown in FIG. 40.

Referring now to FIG. 47, on-operation of the second example of the high withstand voltage semiconductor device will be described. FIG. 47 shows an on-state of the second example of the high withstand voltage semiconductor device.

Referring to FIG. 47, an electric potential of gate electrode 9 is decreased relative to that of source electrode 11. This allows the surface of $n^-$ layer 2 directly under gate electrode 9 to be inverted to p-type. This allows a hole current 37b to flow from $p^+$ diffusion region 3 to $p^+$ diffusion region 6 via $p^-$ diffusion region 5. Responsively, an electron current 37a from n⁺ diffusion region 15 into both p⁻ diffusion region 5 and n⁻ layer 2. This implements a state in which many electrons and holes are stored and causes conductivity modulation. As a result, the on-state will be implemented. In other words, the second example of the high withstand voltage semiconductor device described above serves to operate as a p-channel IGBT.

FIG. 48 is a bird's eye view of the entire structure of the second example of the high withstand voltage semiconductor device described above.

Referring now to FIGS. 49–52, a third example of the conventional high withstand voltage semiconductor device will described. FIG. 49 is a partial cross sectional view of the third example of the high withstand voltage semiconductor device.

Referring to FIG. 49, a buried oxide film 17 is formed on a surface of a semiconductor substrate 16. N⁻ layer 2 is formed on buried oxide film 17. Furthermore, a trench 22 is formed at a predetermined position at n⁻ layer 2. An oxide film 18 is formed on an inner surface of trench 22. A polysilicon layer 19 is buried inside oxide film 18. Other than that structure, the high withstand voltage semiconductor device is similar to the first example of the high withstand voltage semiconductor device shown in FIG. 40.

Referring now to FIGS. 50–52, operation of the third example of the high withstand voltage semiconductor device will be described. FIGS. 50 and 51 show in steps a state of a depletion layer in the high withstand voltage semiconductor device at the time of off-operation. Referring to these figures, similar to the first example of the high withstand voltage semiconductor device described above, electric potentials of drain electrode 12 and substrate electrode 13 are set to be 0V and a positive electric potential (+V) is applied to gate electrode 9 and source electrode 11. This allows a depletion layer to extend mainly from a pn junction which is an interface of p⁻ diffusion region 5 and n⁻ layer 2 and from a pn junction which is an interface of p⁺ diffusion region 6 and n⁻ layer 2.

At that time, the depletion layer starts to extend simultaneously from an interface of n⁻ layer 2 and buried oxide film 17. This contributes to relaxation of electric field. As a result, the RESURF effect described above is obtained. The RESURF effect is described, for example, in S. Merchant et al. "Realization of High Breakdown Voltage (>700V) in Thin SOI Devices" Proc. of 3rd ISPSD, pp.31–35, 1991. Although on-operation of the third example of the high withstand voltage semiconductor device is shown in FIG. 52, its on-operation is not described here since it is the same as the on-operation of the first example of the high withstand voltage semiconductor device described above.

Referring now to FIGS. 53–55, a fourth example of the conventional high withstand voltage semiconductor device will be described. FIG. 53 is a partial sectional view of the fourth example of the conventional high withstand voltage semiconductor device.

Referring to FIG. 53, in the fourth example of the high withstand voltage semiconductor device, p⁺ diffusion region 3 and a p diffusion region 3a are formed in n⁻ layer 2, and n⁺ diffusion region 4 is formed at a surface of p⁺ diffusion region 3. Furthermore, an n⁺ diffusion region 15a is formed such that it is spaced apart from p⁺ diffusion region 3. Furthermore, gate electrode 9 is formed on p diffusion region 3a positioned between n⁺ diffusion region 4 and n⁻ layer 2 with oxide film 10 interposed. Furthermore, source electrode 11 is formed in contact with surfaces of both p⁺ diffusion region 3 and n⁺ diffusion region 4. Drain electrode 12 is formed in contact with a surface of n⁺ diffusion region 15a.

Referring now to FIGS. 54 and 55, operation of the fourth example of the high withstand voltage semiconductor device will be described. FIG. 54 shows a state of a depletion layer of the fourth example of the high withstand voltage semiconductor device at the time of off-operation.

Referring to FIG. 54, electric potentials of source electrode 11, gate electrode 9 and substrate electrode 13 are adapted to be 0V, and a positive electric potential is applied to drain electrode 12. This allows a depletion layer to extend mainly from pn junction A which is an interface of p diffusion region 3a and n⁻ layer 2. At the same time, the depletion layer extends from an interface B of n⁻ layer 2 and buried oxide film 17. This promotes expansion of the depletion layer, thus further widening the depletion layer. In other words, the RESURF effect is obtained. Consequently, a high withstand voltage device is obtained.

The on-operation will now be described. FIG. 55 shows an on-state of the fourth example of the high withstand voltage semiconductor device. Referring to FIG. 55, electric potentials of source electrode 11 and substrate electrode 13 are adapted to be 0V, an electric potential of gate electrode 9 is increased relative to that of source electrode 11, and a positive electric potential (+Vcc) is applied to drain electrode 12. This allows a surface of p⁺ diffusion region 3 directly under gate electrode 9 to be inverted to n-type, thereby forming an inverted region 38. This allows electrons from n⁺ diffusion region 4 to reach n⁻ layer 2 and n⁺ diffusion region 15a via inverted region 38. Consequently, the on-operation will be implemented.

In the first to third examples of the conventional high withstand voltage semiconductor device described above, the resistance value of p⁻ diffusion region 5 is the factor which almost determines the resistance value of the high withstand voltage semiconductor device at the time of on-operation. Therefore, it is desired that the resistance of p⁻ diffusion region 5 be decreased. For that purpose, the use of a technique which increases p-type impurity concentration contained in p⁻ diffusion region 5 is generally considered. However, this restrains the widening of the depletion layer within p⁻ diffusion region 5. Consequently, the electric field tends to be higher within the depletion layer and the withstand voltage of the high withstand voltage semiconductor device will be undesirably decreased.

Furthermore, in the fourth example of the conventional high withstand voltage semiconductor device described above, the resistance value of n⁻ layer 2 serves as the factor which determines the resistance value of the high withstand voltage semiconductor device at the time of on-operation. Therefore, it is desired that the resistance of n⁻ layer 2 be decreased. As a technique for achieving that, similar to the case mentioned above, the use of a technique which increases n-type impurity concentration contained in n⁻ layer 2 is considered. However, in this case also, similar to the first to third examples described above, the widening of the depletion layer within n⁻ layer 2 is restrained and the withstand voltage of the high withstand voltage semiconductor device will be degraded.

Thus, with the conventional high withstand voltage semiconductor device, it has been difficult to realize both decreased resistance value of the device at the time of on-operation and increased withstand voltage of the device at the time of off-operation.

SUMMARY OF THE INVENTION

The present invention is to solve the problems described above. The object of the invention is to provide a high withstand voltage semiconductor device capable of decreasing the resistance value of the device at the time of on-operation while hardly decreasing the withstand voltage of the device at the time of off-operation, and a method of manufacturing the same.

In one aspect of the high withstand voltage semiconductor device according to the present invention, it includes a substrate having a main surface, a semiconductor layer of a first conductivity type, first and second impurity diffusion regions of a second conductivity type, a control electrode, and first and second main electrodes. The semiconductor layer is formed on the main surface of the substrate. The first and second impurity diffusion regions are formed such that they are spaced apart from each other on a surface of the semiconductor layer. The control electrode is formed on a surface of the semiconductor layer positioned between the first and second impurity diffusion regions with an insulating layer interposed. The first main electrode is electrically connected to the first impurity diffusion region. The second main electrode is electrically connected to the second impurity diffusion region. Furthermore, the second impurity diffusion region has a low concentration region containing impurity of the second conductivity type which has a relatively low concentration, and a plurality of high concentration regions containing impurity of the second conductivity type which has a relatively high concentration and connected to the low concentration region.

As described above, in one aspect of the high withstand voltage semiconductor device according to the present invention, the second impurity diffusion region includes both a low concentration region and a plurality of high concentration regions. As the second impurity diffusion region is provided with the high concentration regions, a resistance value of the second impurity diffusion region can be decreased and a resistance value of the high withstand voltage semiconductor device at the time of on-operation can be decreased. Furthermore, as the second impurity diffusion region is provided with the low concentration region, a diffusion layer can be sufficiently widened in the low concentration region at the time of off-operation of the high withstand voltage semiconductor device. Accordingly, the widening of the depletion layer of the high withstand voltage semiconductor device at the time of off-operation will be promoted. Consequently, a high withstand voltage of the semiconductor device at the time of off-operation can be maintained. In other words, the resistance value of the high withstand voltage semiconductor device at the time of on-operation can be decreased while hardly decreasing the withstand voltage of the high withstand voltage semiconductor device at the time of off-operation.

In another aspect, the high withstand voltage semiconductor device according to the present invention is provided with a substrate having a main surface, a semiconductor layer of a first conductivity type, first, second and third impurity diffusion regions of a second conductivity type, a fourth impurity diffusion region of the first conductivity type, a control electrode, a first main electrode, and a second main electrode. The semiconductor layer is formed on the main surface of the substrate. The first impurity diffusion region is formed at a surface of the semiconductor layer. The second impurity diffusion region is formed on a surface of the semiconductor layer such that the second impurity diffusion region is spaced apart from the first impurity diffusion region. The control electrode is formed on a surface of the semiconductor layer positioned between the first and second impurity diffusion regions with an insulating layer interposed. The third impurity diffusion region is formed contiguous to that end of the second impurity diffusion region which is farther from the control electrode. The first main electrode is formed in contact with both a surface of the impurity diffusion region and a surface of the semiconductor layer positioned in the vicinity of the first impurity diffusion region. The fourth impurity diffusion region is formed at a surface of the third impurity diffusion region. The second main electrode is formed in contact with a surface of the fourth impurity diffusion region. Furthermore, on a surface of the second impurity diffusion region, a fifth impurity diffusion region of the first conductivity type containing impurity of the first conductivity type the amount of which is almost the same as that of the impurity of the first conductivity type contained in the semiconductor layer is formed, and the fifth impurity diffusion region is connected to the semiconductor layer.

As described above, in another aspect of the high withstand voltage semiconductor device, a fifth impurity diffusion region is formed at a surface of the second impurity diffusion region. In other words, the fifth impurity diffusion region and the semiconductor layer are positioned above and below the second impurity diffusion region, respectively. With this structure, at the time of on-operation of the high withstand voltage semiconductor device in this aspect, a region will exist in which modulation will occur above and below the second impurity diffusion region. This improves modulation efficiency when compared with the case in which the fifth impurity diffusion region is not formed. Consequently, switching operation rate can be improved. Also, at the time of off-operation of the high withstand voltage semiconductor device, a depletion layer can extend from pn junctions positioned above and below the second impurity diffusion region. This allows the depletion layer to effectively extend within the second impurity diffusion region. Consequently, a high withstand voltage at the time of off-operation can be maintained.

In another aspect, the high withstand voltage semiconductor device according to the present invention is provided with a substrate having a main surface, a semiconductor layer of a first conductivity type, a first impurity diffusion region of a second conductivity type, second and third impurity diffusion regions of the first conductivity type, a control electrode, and first and second main electrodes. The semiconductor layer is formed on the main surface of the substrate. The first impurity diffusion region is formed at a surface of the semiconductor layer. The second impurity diffusion region is formed at a surface of the first impurity diffusion region. The third impurity diffusion region is formed on a surface of the semiconductor layer such that the third impurity diffusion region is spaced apart from the first impurity diffusion region. The control electrode is formed on a surface of the first impurity diffusion region positioned between the second and third impurity diffusion regions with an insulating layer interposed. The first main electrode is formed in contact with both a surface of the second impurity diffusion region and a surface of the first impurity diffusion region proximate to the second impurity diffusion region. The second main electrode is formed in contact with a surface of the third impurity diffused region. Furthermore, a plurality of fourth impurity diffusion regions of the second type are formed at bottom regions of the semiconductor layer positioned between the first and third impurity diffusion regions.

As described above, in another aspect of the high withstand voltage semiconductor device, fourth impurity diffusion regions are formed at bottom regions of the semiconductor layer proximate to the main surface of the substrate.

As the fourth impurity diffusion regions are formed, the widening of a depletion layer from a junction of the substrate in the semiconductor layer can be promoted. This improves a withstand voltage of the high withstand voltage semiconductor device at the time of off-operation. Furthermore, this maintains a high withstand voltage of the high withstand voltage semiconductor device, even when a concentration of the impurity of the first conductivity type contained in the semiconductor layer is increased. Consequently, a resistance value of the high withstand voltage semiconductor device at the time of on-operation can be decreased.

In another aspect of the high withstand voltage semiconductor device according to the present invention, it is provided with a substrate having a main surface, a semiconductor layer of a first conductivity type, first and fourth impurity diffusion regions of a second conductivity type, second, third and fifth impurity diffusion regions of the first conductivity type, a control electrode, and first, second and third electrode layers. The semiconductor layer is formed on the main surface of the substrate. The first impurity diffusion region is formed at a surface of the semiconductor layer. The second and third impurity diffusion regions are formed such that they are spaced apart from each other on a surface of the first impurity diffusion region. The fourth impurity diffusion region is formed at a surface of the second impurity diffusion region. The fifth impurity diffusion region is formed on a surface of the first impurity diffusion region such that the fifth impurity diffusion region is spaced apart from the third impurity diffusion region. The control electrode is formed on a surface of the first impurity diffusion region positioned between the second and the third impurity diffusion regions with an insulating layer interposed. The first electrode layer is formed in contact with surfaces of the second and fourth impurity diffusion regions. The second electrode layer is formed in contact with a surface of the third impurity diffusion region. The third electrode layer is formed in contact with a surface of the fifth impurity diffusion region. Furthermore, the first impurity diffusion region positioned between the third and fifth impurity diffusion regions includes a low concentration region containing impurity of the second conductivity type which has a relatively low concentration, and a plurality of high concentration regions including impurity of the second conductivity type which has a relatively high concentration and spaced apart from one another.

As described above, in another aspect of the high withstand voltage semiconductor device, the first impurity diffusion region positioned between the third and fifth impurity diffusion regions has a low concentration region and high concentration regions. As the first impurity diffusion region has the low concentration region, a depletion layer can be sufficiently widened in the low concentration region at the time of off-operation of the high withstand voltage semiconductor device. This improves the withstand voltage of the high withstand voltage semiconductor device at the time of off-operation. Furthermore, as the first impurity diffusion region has a plurality of high concentration regions, a resistance value of the first impurity diffusion region can be decreased. This decreases the resistance value of the high withstand voltage semiconductor device at the time of on-operation. Thus, the resistance value of the high withstand voltage semiconductor device at the time of on-operation can be decreased without decreasing the withstand voltage of the high withstand voltage semiconductor device at the time of off-operation.

In a method for manufacturing the high withstand voltage semiconductor device according to the present invention, a semiconductor layer of a first conductivity type is firstly formed on a main surface of a substrate. An insulating layer is formed on a surface the semiconductor layer and the insulating layer is patterned. A conductive layer containing impurity of a second conductivity type having a relatively high concentration is formed such that it covers the patterned insulating layer and a surface of the semiconductor layer. By diffusing impurity of the first conductivity type from the conductive layer into the semiconductor layer, a plurality of first impurity diffusion regions of the second conductivity type containing impurity of the second conductivity type having a relatively low concentration are formed on surfaces of the semiconductor layer such that they are spaced apart from one another. Furthermore, the conductive layer is patterned, and the first impurity diffusion regions are electrically connected by the conductive layer. Furthermore, a second impurity diffusion region of the second conductivity type is formed on a surface of the semiconductor layer such that the second impurity diffusion region is spaced apart from the first impurity diffusion regions. A control electrode is formed on a surface of the semiconductor layer positioned between the first and the second impurity diffusion regions with an insulating layer interposed. First and second main electrodes are formed on portions of a surface of the semiconductor layer.

As described, in one aspect of the method for manufacturing the high withstand voltage semiconductor device according to the present invention, a conductive layer containing the second conductivity type of impurity having a relatively high concentration is formed on a surface of the semiconductor layer, and a plurality of first impurity diffusion regions containing the second conductivity type of impurity having a relatively low concentration are formed by diffusing the impurity from the conductive layer into the semiconductor layer. Thus, by forming in the semiconductor layer a plurality of the first impurity diffusion regions containing impurity of the second conductivity type having a relatively low concentration, a depletion layer can be sufficiently widened in the first impurity diffusion regions at the time of off-operation of the high withstand voltage semiconductor device. This improves a withstand voltage of the high withstand voltage semiconductor device at the time of off-operation. Furthermore, the first impurity diffusion regions are connected to one another by the conductive layer. As the conductive layer contains impurity of the second conductivity type having a relatively high concentration, its resistance value will be low. Furthermore, as a current flows through both the first impurity diffusion regions and the conductive layer at the time of on-operation of the high withstand voltage semiconductor device, a resistance value of the current path can be decreased by providing the conductive layer described above. This decreases a resistance value of the high withstand voltage semiconductor device at the time of on-operation.

In another aspect of the method for manufacturing the high withstand voltage semiconductor device according to the present invention, a semiconductor layer of a first conductivity type is firstly formed on a main surface of a substrate. An insulating layer is formed on the main surface of the semiconductor layer and the insulating layer is patterned. By using the patterned insulating layer as a mask and selectively introducing and diffusing impurity of a second conductivity type at a surface of the semiconductor layer, a plurality of first impurity diffusion regions of the second conductivity type containing impurity of the second conductivity type having a relatively low concentration are formed on surfaces of the semiconductor layer. Furthermore, a conductive layer containing impurity of the second conductivity type having a relatively high concentration is formed such that it covers surfaces of the insulating layer and the semiconductor layer. The conductive layer is patterned, and the first impurity diffusion regions are electrically connected by the conductive layer. A second impurity diffusion region of the second conductivity type is formed on a surface of the semiconductor layer such that the second impurity diffusion region is spaced apart from the first impurity diffusion region. A control electrode is formed on a surface of the semiconductor layer positioned between the first and second impurity diffusion regions with an insulating layer interposed. First and second main electrodes are formed on portions of a surface of the semiconductor layer.

Also in another aspect described above of the manufacturing method, similar to the one aspect described above of the manufacturing method, a plurality of the first impurity diffusion regions containing impurity of the second conductivity type having a relatively low concentration are connected by a conductive layer containing impurity having a relatively high concentration. This decreases a resistance value of the high withstand voltage semiconductor device at the time of on-operation, as is the case of the one aspect described above. Furthermore, by providing the first impurity diffusion regions, a high withstand voltage of the high withstand voltage semiconductor device at the time of off-operation can also be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, referring to FIGS. 1–39, embodiments of the present invention will be described.

[First Embodiment]

Figure 1:
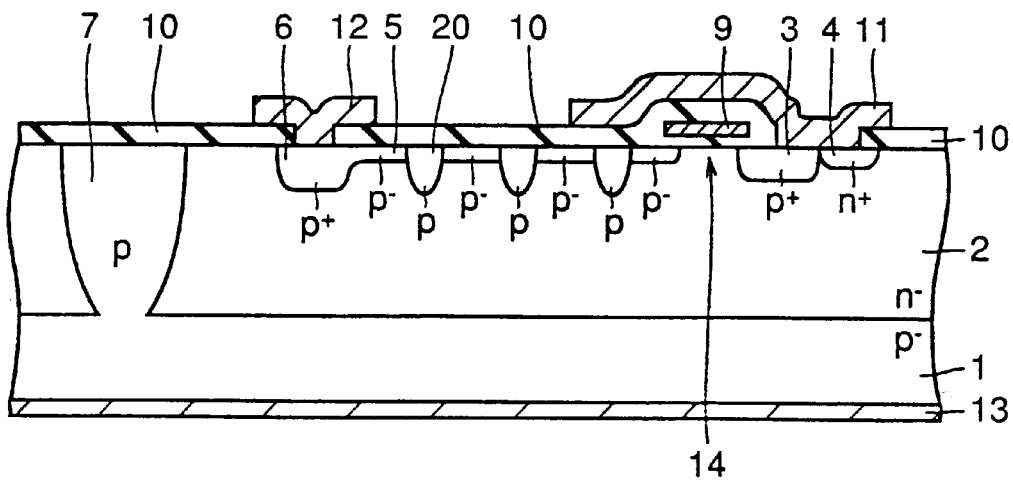
FIG. 1 is a partial cross sectional view of a first embodiment of the high withstand voltage semiconductor device according to the present invention.

FIG. 1 is a partial cross sectional view of a first embodiment of the present invention. More specifically, the figure shows an embodiment in which the present invention is applied to a p-channel MOS device. Referring to FIG. 1, an n⁻ layer 2 is formed on a main surface of p-type semiconductor substrate 1. A p diffusion region 7 tis formed such that it penetrates n⁻ layer 2 to reach p-type semiconductor substrate 1. A p-channel MOS transistor 14 is formed at a surface of n⁻ layer 2. P-channel MOS transistor 14 is provided with a p⁻ diffusion region 5, a p⁺ diffusion region 3 and a gate electrode 9. Gate electrode 9 is formed on a surface of n⁻ layer 2 positioned between p⁻ diffusion region 5 and p⁺ diffusion region 3 with an oxide film 10 interposed.

An n⁺ diffusion region 4 is formed adjacent to p⁺ diffusion region 3. Furthermore, a p⁺ diffusion region 6 is formed contiguous to one end of p⁻ diffusion region 5. A drain electrode 12 is formed in contact with a surface of p⁺ diffusion region 6, and a source electrode 11 is formed in contact with a surface of p⁺ diffusion region 3 and a surface of n⁺ diffusion region 4. Source electrode 11 extends above gate electrode 9 and on p⁻ diffusion region 5, as shown in FIG. 1.

Figure 48:
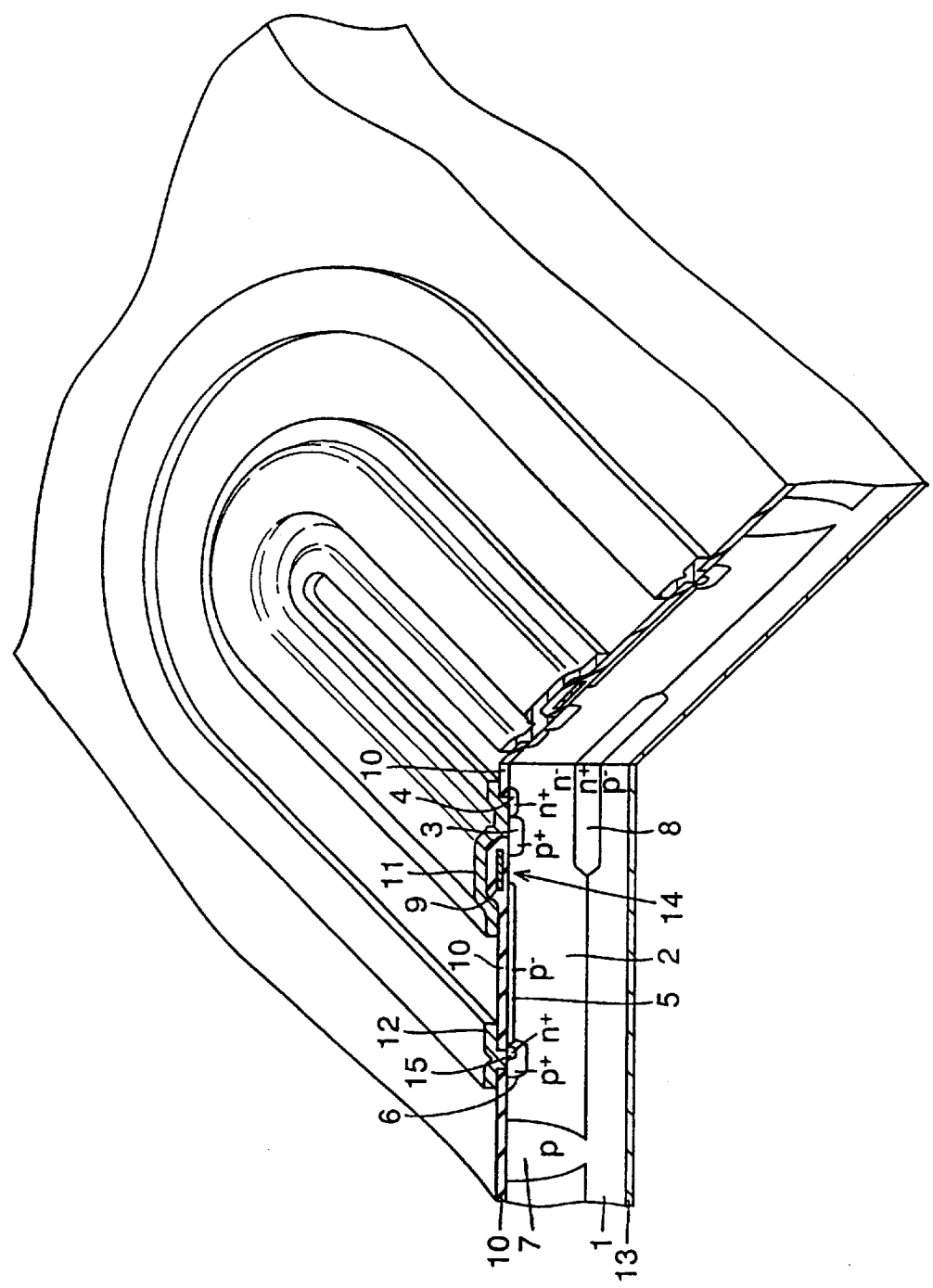
FIG. 48 is a bird's eye view of the entire structure of the high withstand voltage semiconductor device shown in FIG. 44.
Figure 49:
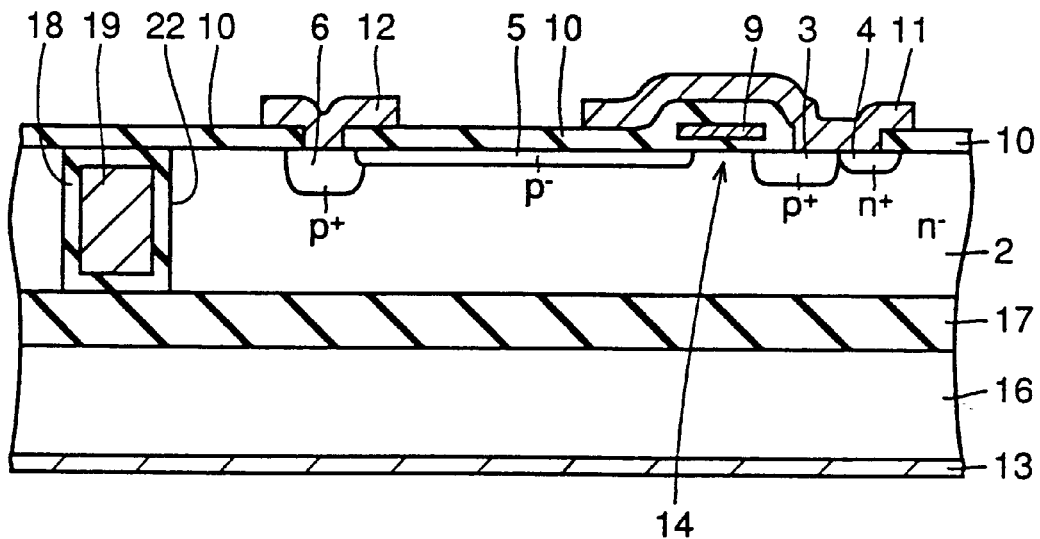
FIG. 49 is a partial cross sectional view of a third example of the conventional high withstand voltage semiconductor device.
Figure 50:
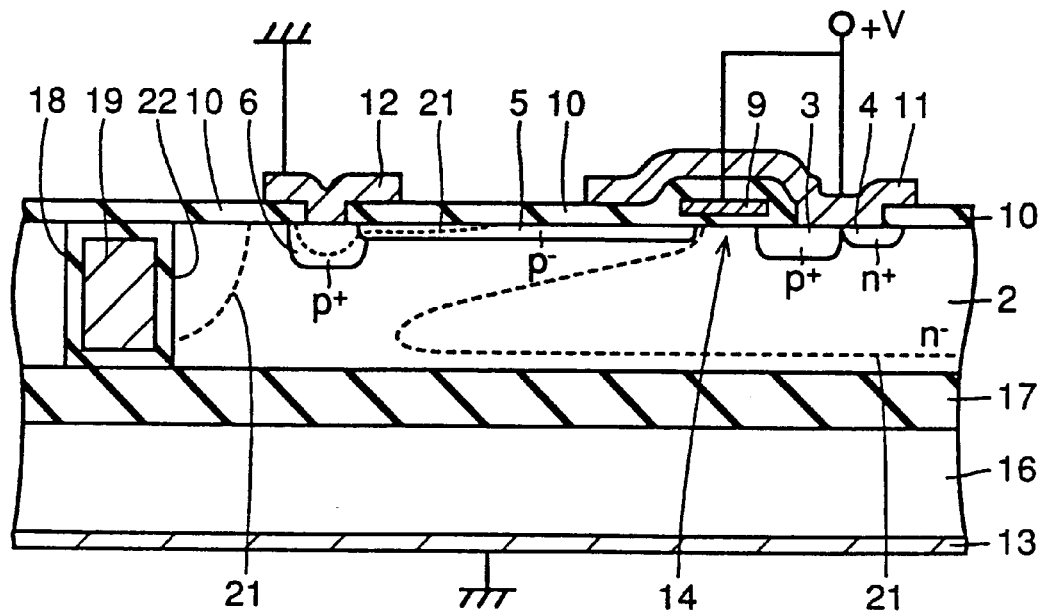
FIG. 50 shows a state of a depletion layer of the conventional high withstand voltage semiconductor device shown in FIG. 49 at the time of off-operation.
Figure 51:
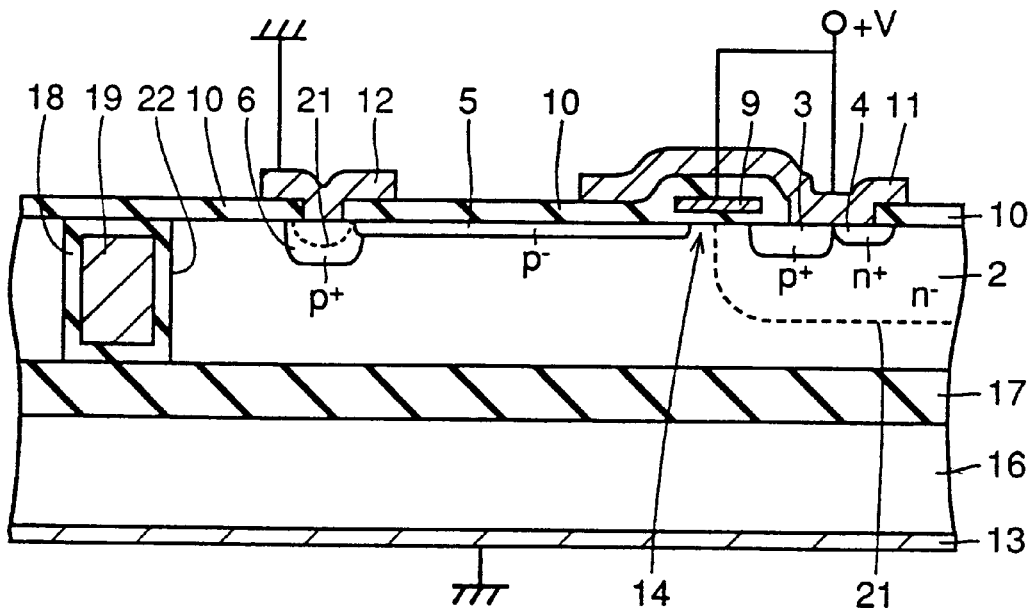
FIG. 51 shows a state of the depletion layer of the high withstand voltage semiconductor device shown in FIG. 49 at the time of off-operation.
Figure 52:
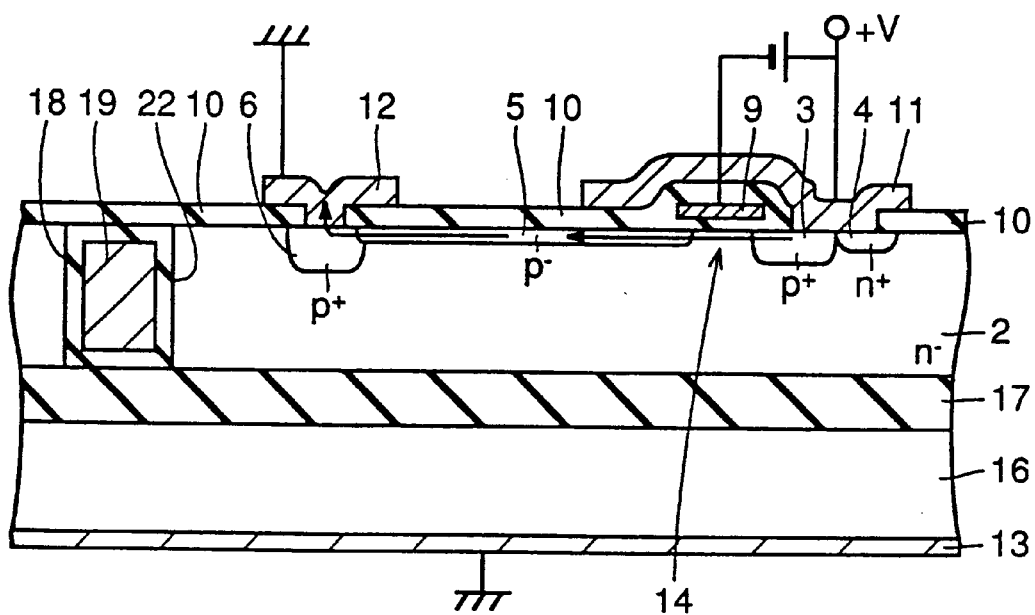
FIG. 52 shows an on-operation of the high withstand voltage semiconductor device shown in FIG. 49.
Figure 53:
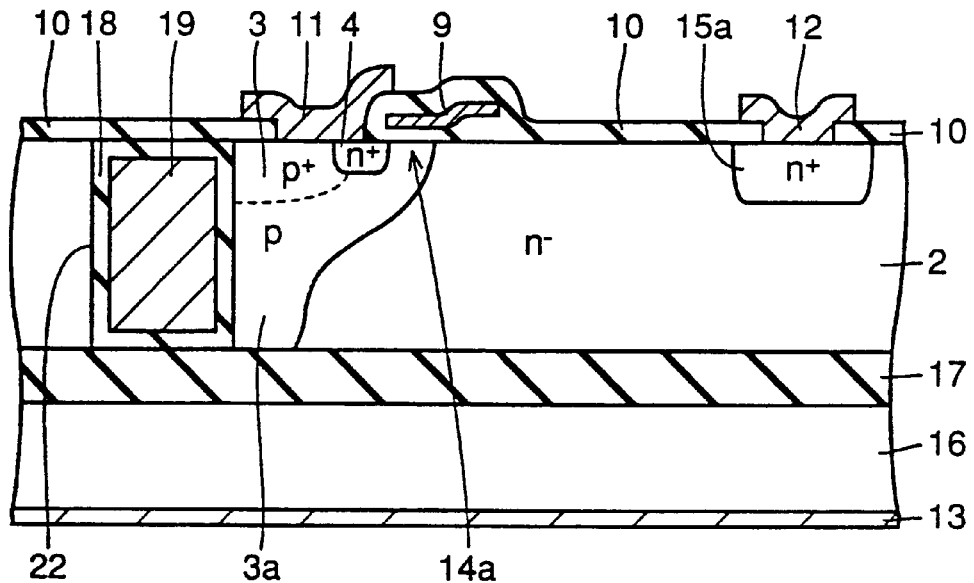
FIG. 53 is a partial cross sectional view of a fourth example of the conventional high withstand voltage semiconductor device.
Figure 54:
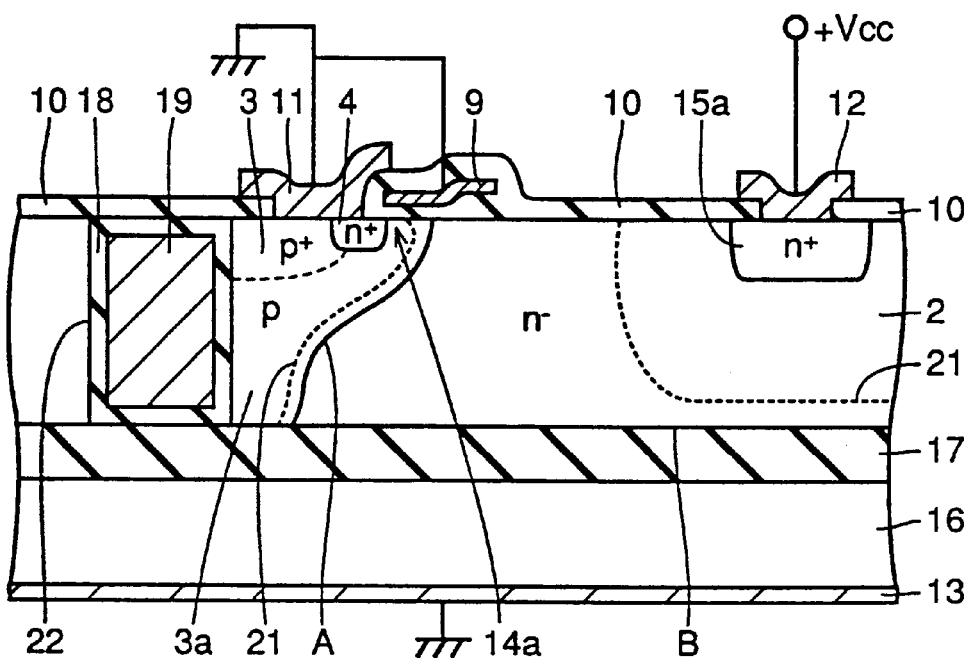
FIG. 54 shows a state of a depletion layer of the conventional high withstand voltage semiconductor device shown in FIG. 53 at the time of off-operation.
Figure 55:
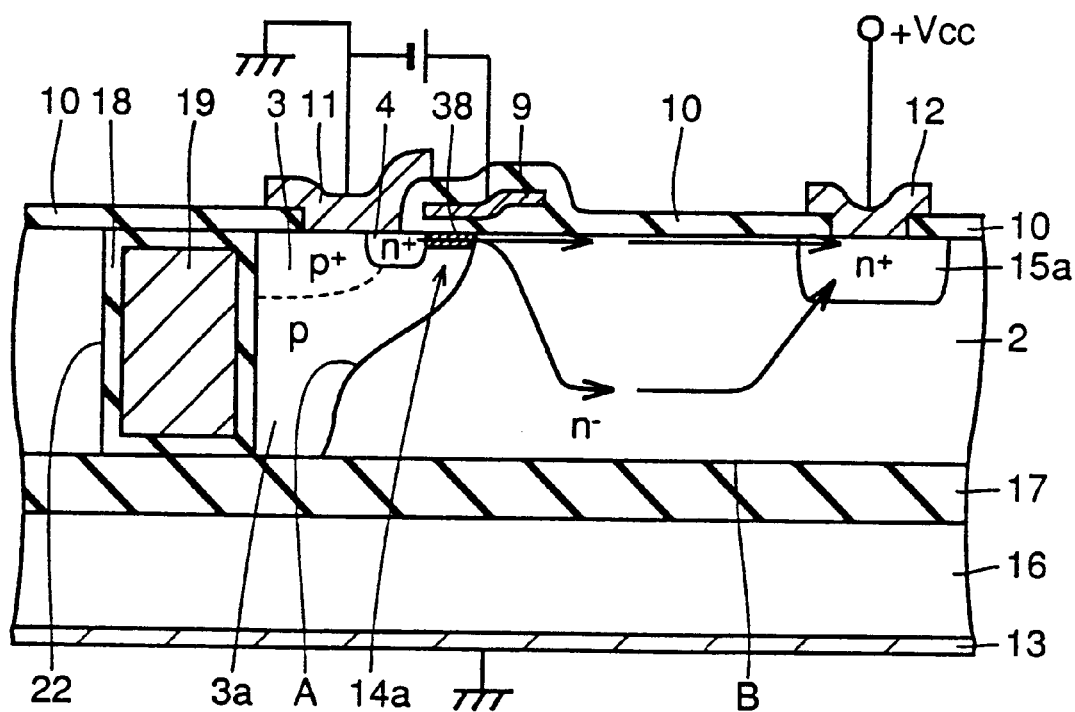
FIG. 55 shows an off-operation of the high withstand voltage semiconductor device shown in FIG. 53.

Furthermore, a p diffusion region 20 is formed such that it reaches n⁻ layer 2 from p⁻ diffusion region 5. As the entire structure of the high withstand voltage semiconductor device shown in FIG. 1 is almost the same as that of the conventional high withstand voltage semiconductor device shown in FIG. 48, p diffusion region 20 has a ring-shaped planar structure.

Now, p diffusion region 20 will be described in detail. It is preferred that a p-type impurity concentration contained in p diffusion region 20 (in the present specification, "impurity concentration" means the peak concentration of the impurity) be at least approximately 10–100 times p-type impurity concentration contained in p⁻ diffusion region 5. Furthermore, it is preferred that a plurality of p diffusion regions 20 be provided such that they are spaced apart from one another in the longitudinal direction of p⁻ diffusion region 5. By providing a plurality of p diffusion regions 20 such that they are spaced apart from one another in p⁻ diffusion region 5 as described, the widening of a depletion layer of the high withstand voltage semiconductor device at the time of off-operation will be promoted in the horizontal direction.

Figure 2:
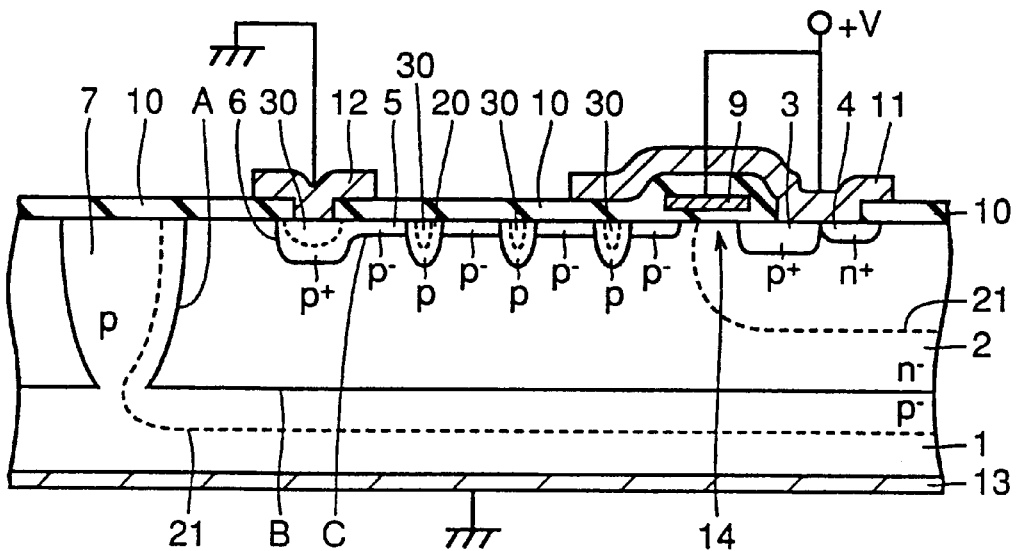
FIG. 2 is a cross sectional view illustrating a state of a depletion layer of the high withstand voltage semiconductor device shown in FIG. 1 at the time of off-operation.

FIG. 2 shows a state of a depletion layer of the first embodiment of the high withstand voltage semiconductor device at the time of off-operation. In FIG. 2, the reference numeral 21 indicates an edge of the depletion layer. Referring to FIG. 2, electric potentials of a substrate electrode 13 and drain electrode 12 are set to be 0V, and a positive electric potential (+V) is applied to gate electrode 9 and source electrode 11. This allows a depletion layer to widen from pn junctions A, B and C.

Particularly, the widening of the depletion layer in the horizontal direction is promoted in the vicinity of a surface of n⁻ layer 2 due to the presence of ring-shaped p diffusion region 20. Although a non-depleted region 30 remains at portions of p⁺ diffusion region 6 and p diffusion region 20, the depletion layer is sufficiently widened in n⁻ layer 2. This relaxes an electric field strength in the depletion layer and the same effect as the RESURF effect is obtained. The structure corresponding to ring-shaped p diffusion region 20 is referred to as Floating Field Rings and has an effect to promote widening of a depletion layer. This is described, for example, in B. J. Balign, *Modern Power Devices*, 1987, pp.92–99.

Figure 3A:
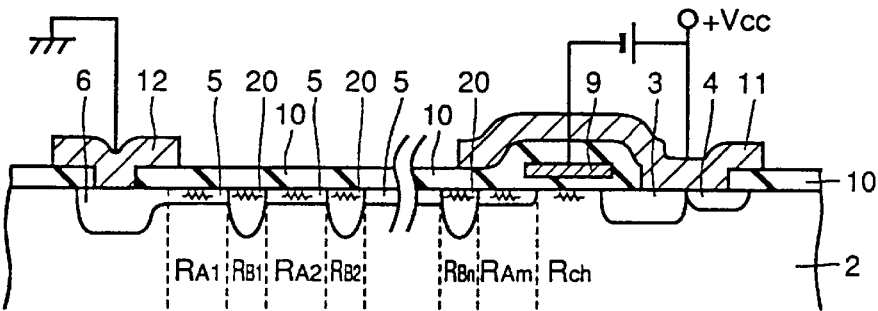
FIG. 3A shows resistance components of the high withstand voltage semiconductor device shown in FIG. 1 at the time of on-operation.
Figure 3B:
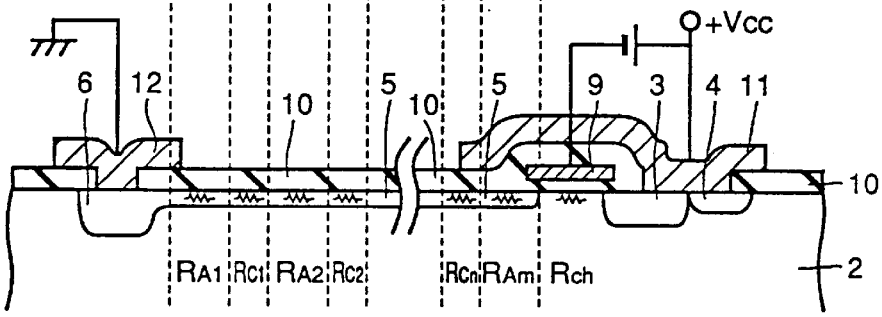
FIG. 3B shows resistance components of a conventional high withstand voltage semiconductor device at the time of on-operation.

Referring now to FIGS. 3A and 3B, an on-operation of the first embodiment of the high withstand voltage semiconductor device shown in FIG. 1 will be described. FIG. 3A shows a state of the on-operation of the high withstand voltage semiconductor device shown in FIG. 1. FIG. 3B shows a state of a conventional high withstand voltage semiconductor device at the time of on-operation.

Referring firstly to FIG. 3A, the on-operation of the high withstand voltage semiconductor device is implemented by adapting electric potentials of drain electrode 12 and substrate electrode (not shown) to be 0V, applying a positive electric potential (+Vcc) to source electrode 11 and decreasing an electric potential of gate electrode 9 as compared with that of source electrode 11. Then, a surface of n⁻ layer 2 directly under gate electrode 9 is inverted to p-type and a current flows from source electrode 11 to drain electrode 12.

In this figure, the resistance components of p⁻ diffusion region 5 are indicated as $R_{A1}$, $R_{A2}$ ... $R_{Am}$, the resistance components of p diffusion region 20 are indicated as $R_{B1}$, $R_{B2}$ ... $R_{Bn}$, and the resistance component of a channel region directly under gate electrode 9 is indicated as Rch. On the other hand, As shown in FIG. 3B, the resistance components of p⁻ diffusion region 5, the position of which corresponds to that of p diffusion region 20 of the conventional example are indicated as $R_{C1}$, $R_{C2}$ ... $R_{Cn}$.

When the total resistance of p⁻ diffusion region 5 and p diffusion region 20 in the first embodiment is indicated as Rtot(N) and the total resistance of p⁻ diffusion region 5 in the conventional example is indicated as Rtot(O), each of the total resistances is expressed as follows:

$$Rtot(N) = \sum_{i=1}^{m} R_A i + \sum_{i=1}^{n} R_B i + Rch \quad (1)$$

$$Rtot(0) = \sum_{i=1}^{m} R_A i + \sum_{i=1}^{n} R_C i + Rch$$

Then, the value of Rtot(O)–Rtot(N) is expressed as follows:

$$Rtot(0) - Rtot(N) = \sum_{i=1}^{n} R_C i - \sum_{i=1}^{n} R_B i \quad (2)$$

As a p-type impurity concentration contained in p diffusion region 20 is higher than a p-type impurity concentration contained in p⁻ diffusion region 5 as described above, the relation $R_{Bi} > R_{Ci}$ is established.

Therefore, the relations as follows can be obtained:

Rtot(O)–Rtot(N)>0

Rtot(N)<Rtot(O)          (3)

Thus, by providing p diffusion region 20, a resistance value of the high withstand voltage semiconductor device at the time of on-operation can be decreased.

In view of the above, it is considered that by uniformly increasing the concentration of the entire p⁻ diffusion region 5, the resistant value of the high withstand voltage semiconductor device at the time of on-operation can further be effectively decreased. Therefore, the inventor of the present application has studied a technique for uniformly increasing the concentration of the entire p⁻ diffusion region 5. The result will be described hereinafter.

Figure 4:
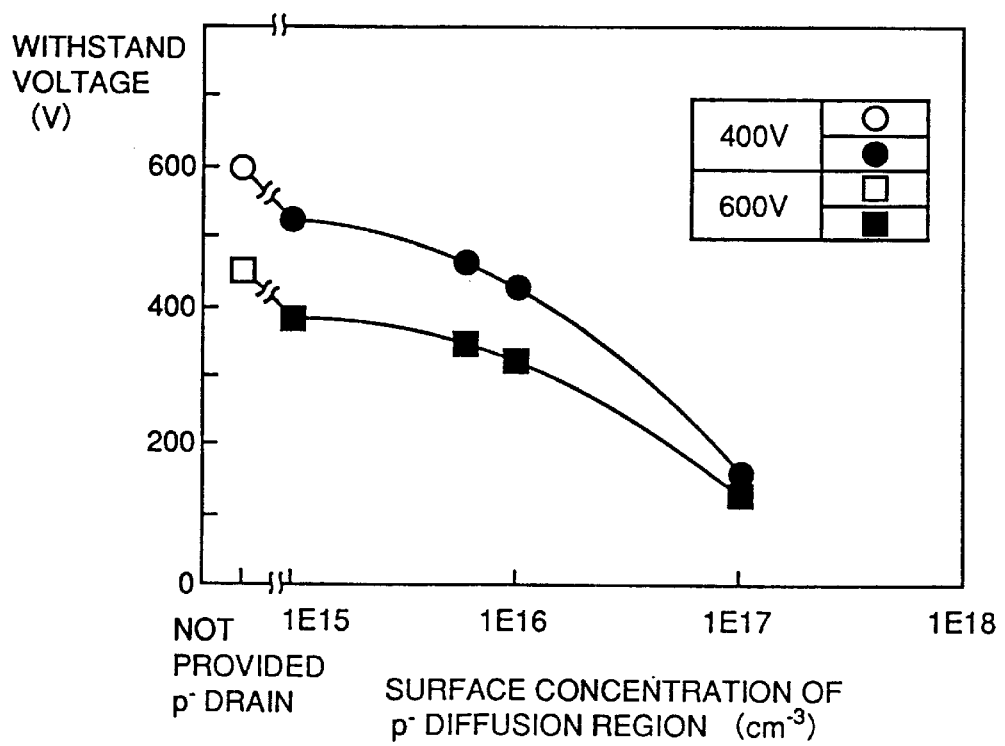
FIG. 4 shows the relation between surface concentration of a p$^-$ diffusion region and withstand voltage.

FIG. 4 shows a result of computer simulation regarding the change in withstand voltage of the high withstand voltage semiconductor device relative to the surface concentration of p⁻ diffusion region 5. Conditions corresponding to p-type semiconductor substrate 1 are controlled and two models have been examined which have withstand voltages of 450V and 600V, respectively, in the absence of p⁻ diffusion region 5. As shown in FIG. 4, the withstand voltage of either of the two models tends to decrease as surface concentration increases. Furthermore, it can be seen that when the surface concentration reaches a concentration of 1E17 $cm^{-3}$, the withstand voltage of either of the two models decreases to approximately 150V regardless of the initial design conditions.

Figure 5A:
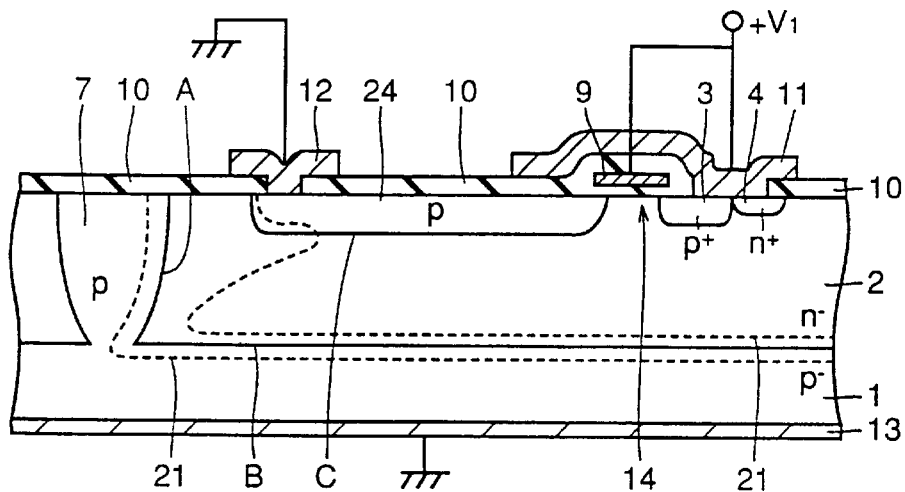
FIGS. 5A–5C show in steps a state of a depletion layer at the time of off-operation. When the concentration of p diffusion region 24 is uniformly increased.
Figure 5B:
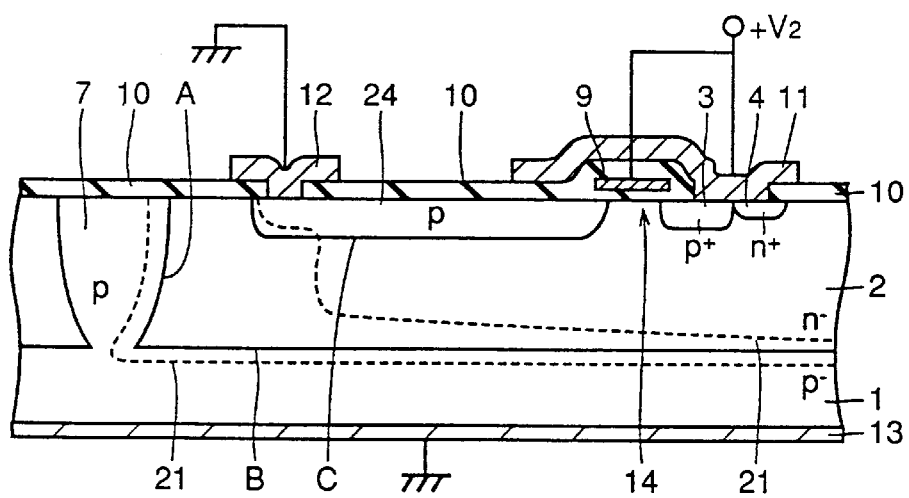
Figure 5C:
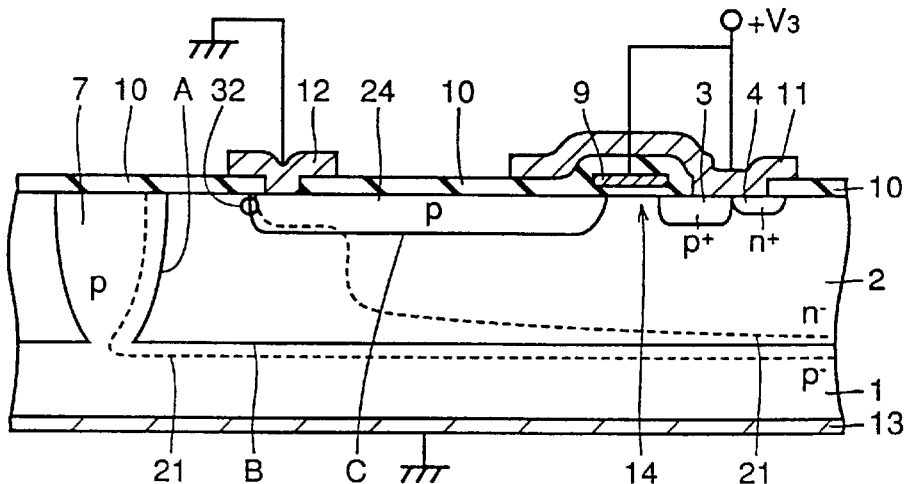
Figure 6A:
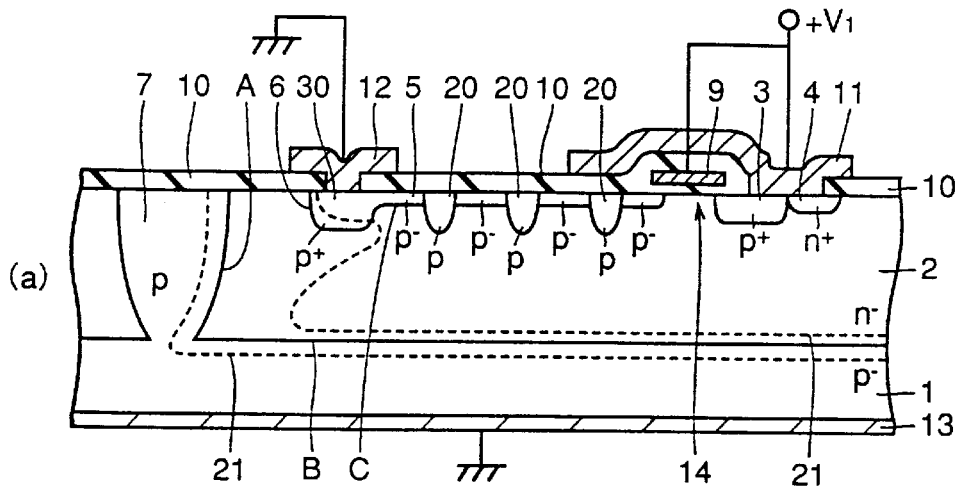
FIGS. 6A–6C show in steps a state of a depletion layer of the high withstand voltage semiconductor device shown in FIG. 1 at the time of off-operation.
Figure 6B:
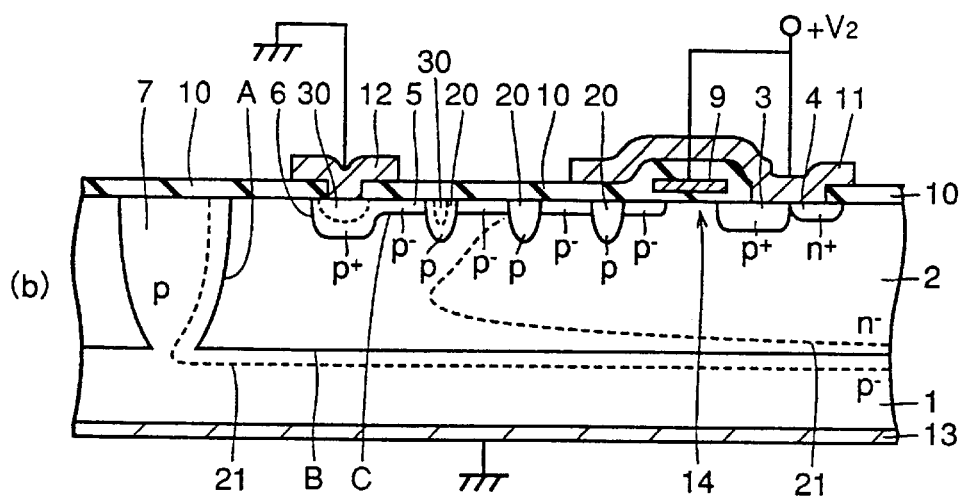
Figure 6C:
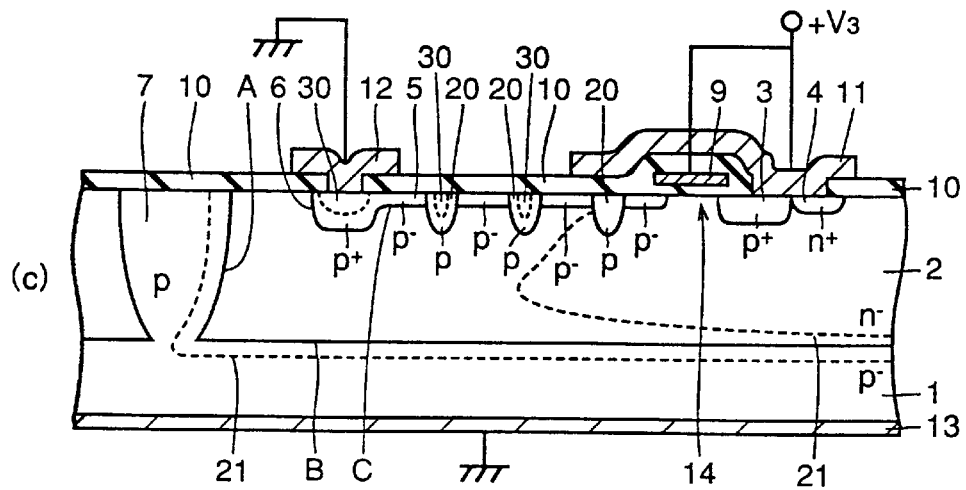

Considering now the above, a case in which the concentration of p⁻ diffusion region 5 is uniformly increased will be compared with a case in which p diffusion region 20 is provided as is in the first embodiment. FIGS. 5A–5C are cross sectional views illustrating a state of a depletion layer when positive electric potentials (+V1<+V2<+V3) are sequentially applied to a high withstand voltage semiconductor device having a p diffusion region 24 the concentration of which is uniformly increased. FIG. 6A–6C are cross sectional views illustrating a state of a depletion layer when the positive electric potentials +V1, +V2, +V3 described above are sequentially applied to the first embodiment of the high withstand voltage semiconductor device.

Referring firstly to FIG. 5A, by applying positive electric potential +V1, a depletion layer starts to extend from pn junctions A, B, C. Then, by applying a higher electric potential, the depletion layer extends towards source electrode 11 as shown in FIGS. 5B and 5C. However, As the concentration of p diffusion region 24 is uniformly high, the degree of the widening of the depletion layer gradually decreases as it approaches source electrode 11. Then, as shown in FIG. 5C, there is generated an electric field concentration point 32, causing an avalanche breakdown.

On the other hand, in the first embodiment of the high withstand voltage semiconductor device of the present invention, as shown in FIGS. 6A–6C sequentially, the depletion layer extends smoothly towards source electrode 11 as higher voltages are sequentially applied. This is because p⁻ diffusion region 5 exists between p diffusion regions 20. As shown in FIGS. 6B and 6C, a non-depleted region 30 remains in diffusion region 20 when the depletion layer extends. However, as p⁻ diffusion region 5 exists at a position adjacent to p diffusion region 20, the widening of the depletion layer is promoted. In other words, due to the presence of p⁻ diffusion region 5 between p diffusion regions 20, depletion layer continues to extend while p⁻ diffusion region 5 is completely depleted. Thus the depletion layer expands sufficiently and a withstand voltage of the high withstand voltage semiconductor device can be improved at the time of off-operation.

Thus, in the first embodiment of the high withstand voltage semiconductor device, the resistance value of the high withstand voltage semiconductor device at the time of on-operation can be decreased without degrading the withstand voltage of the high withstand voltage semiconductor device at the time of off-operation.

[Second Embodiment]

Figure 7:
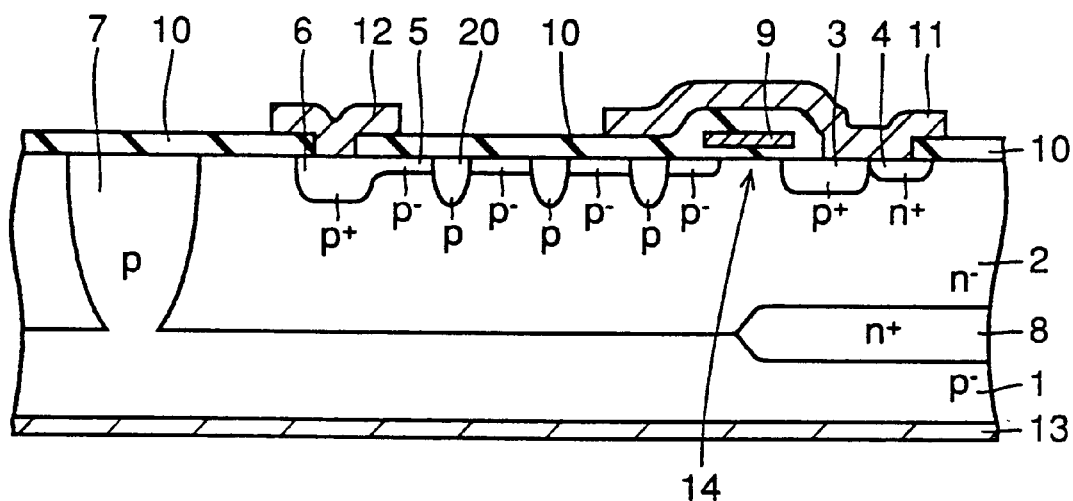
FIG. 7 is a partial cross sectional view of a second embodiment of the high withstand voltage semiconductor device according to the present invention.
Figure 8:
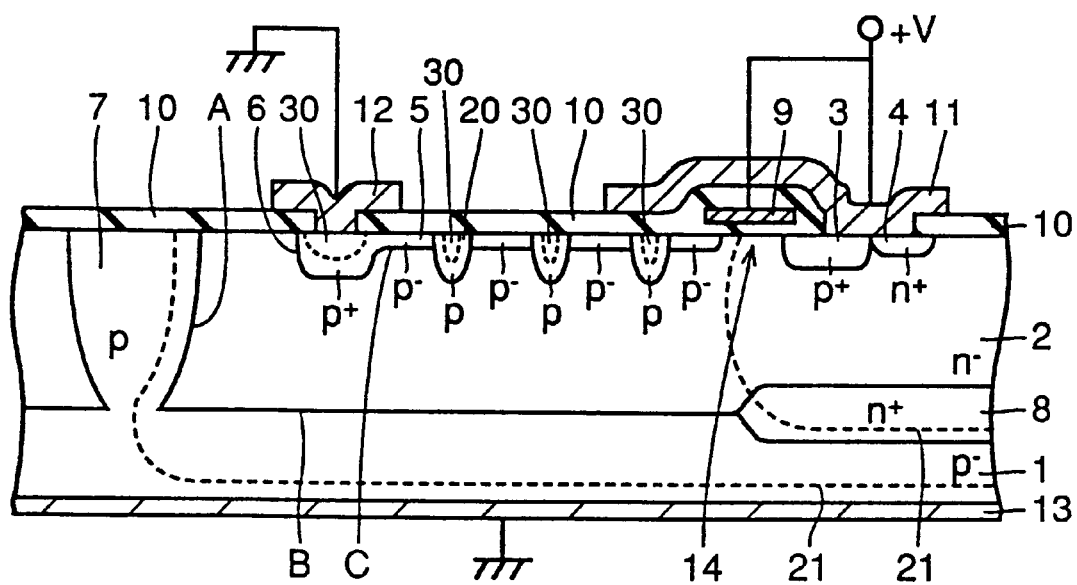
FIG. 8 shows a state of a depletion layer of the high withstand voltage semiconductor device shown in FIG. 7 at the time of off-operation.

Referring now to FIGS. 7 and 8, a second embodiment of the present invention will be described. FIG. 7 is a partial cross sectional view of the second embodiment of the high withstand voltage semiconductor device of the present invention.

Referring to FIG. 7, the high withstand voltage semiconductor device shown in the figure differs from the one shown in FIG. 1 in that an n⁺ buried diffusion region 8 is formed. Other than that structure, the device is the same as the one shown in FIG. 1.

By providing n⁺ buried diffusion region 8 as described above, an effect described below can be obtained. FIG. 8 shows a state of a depletion layer of the high withstand voltage semiconductor device shown in FIG. 7 at the time of off-operation. By providing n⁺ buried diffusion region 8 as described above, the depletion layer can be prevented from widening in n⁻ layer 2 positioned between n⁺ buried diffusion region 8 and p⁺ diffusion region 3, as shown in FIG. 8. Accordingly, the depletion layer extends in p-type semiconductor substrate 1 positioned under n⁺ buried diffusion region 8. At that time, the depletion layer can be sufficiently widened, since p-type semiconductor substrate 1 has a low concentration and is thick. This further improves a withstand voltage of the high withstand voltage semiconductor device at the time of off-operation.

[Third Embodiment]

Figure 9:
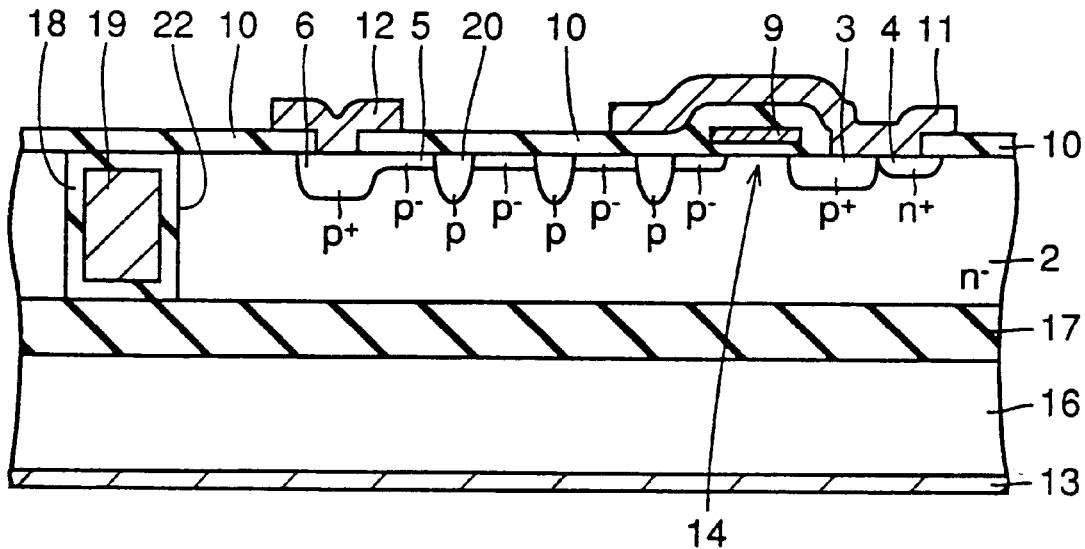
FIG. 9 is a partial cross sectional view of a third embodiment of the high withstand voltage semiconductor device according to the present invention.
Figure 10:
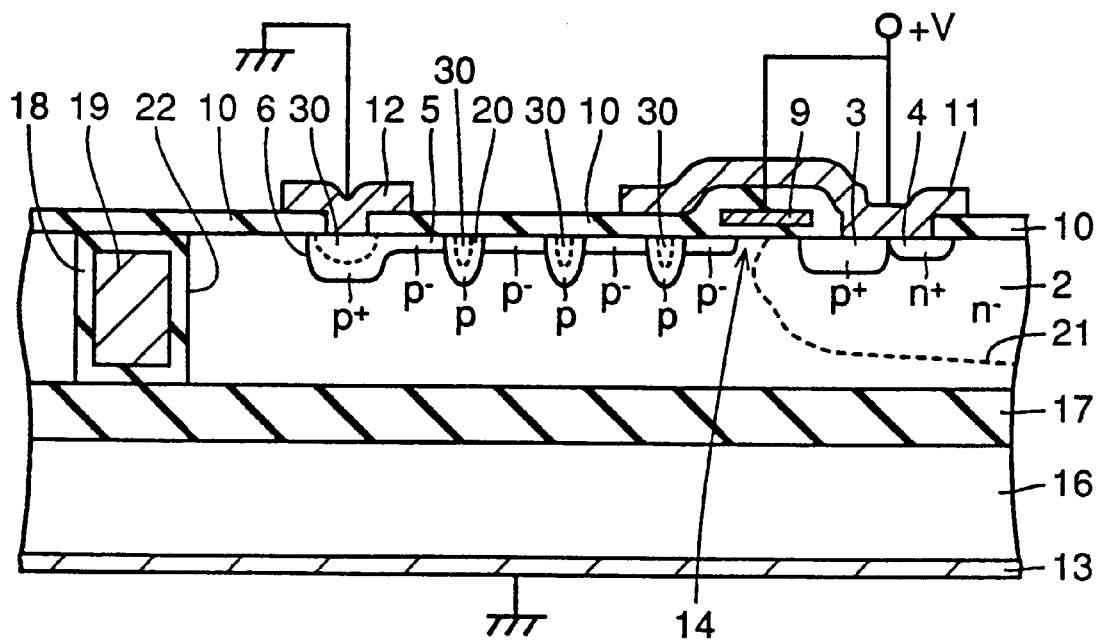
FIG. 10 shows a state of a depletion layer of the high withstand voltage semiconductor device shown in FIG. 9 at the time of off-operation.

Referring now to FIGS. 9 and 10, a third embodiment of the present invention will be described. FIG. 9 is a partial sectional view of the third embodiment of the high withstand voltage semiconductor device according to the present invention.

Referring to FIG. 9, in the third embodiment of the high withstand voltage semiconductor device, a buried oxide film 17 is formed on a surface of a semiconductor substrate 16 and n⁻ layer 2 is formed on a surface of buried oxide film 17. In other words, a high withstand voltage semiconductor device having the SOI (Semiconductor On Insulator) structure is shown. Then, a trench 22 is provided so that it penetrates n⁻ layer 2, and an oxide film 18 and a polysilicon layer 18 are buried within trench 22. Other than that structure, the device is the same as the first embodiment of the high withstand voltage semiconductor device shown in FIG. 1.

FIG. 10 shows a state of a depletion layer of the third embodiment of the high withstand voltage semiconductor device at the time of off-operation. As shown in FIG. 10, the depletion layer extends sufficiently in n⁻ layer 2 while a non-depleted region 30 remains. In this case also, the expansion of the depletion layer is promoted in the horizontal direction due to the presence of p diffusion region 20 and p⁻ diffusion region 5. This allows the RESURF effect to occur effectively, and the withstand voltage at the time of off-operation is improved. Regarding the on-operation, the same effect as the case of the first embodiment can be obtained.

[Fourth Embodiment]

Figure 11:
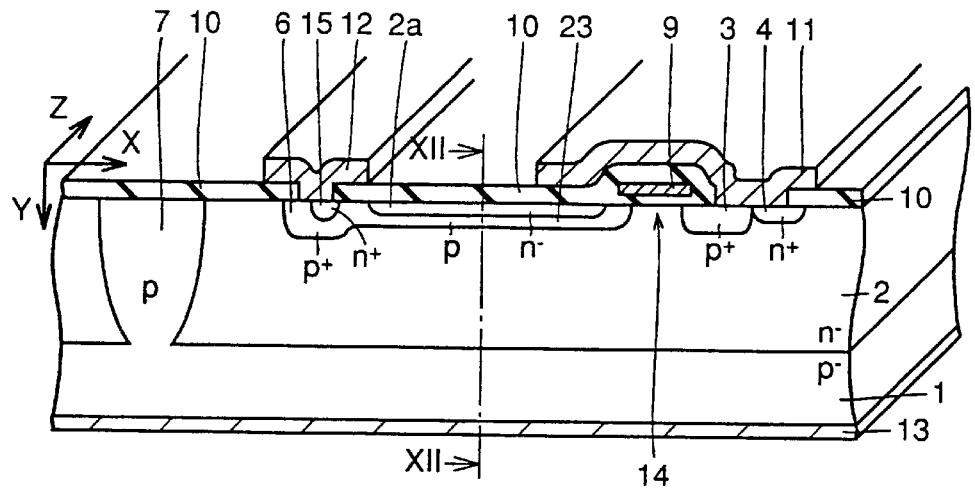
FIG. 11 is a perspective view of a fourth embodiment of the high withstand voltage semiconductor device according to the present invention.
Figure 12:
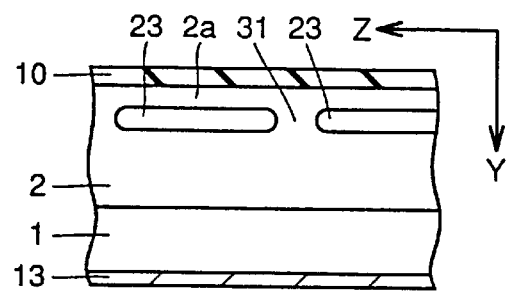
FIG. 12 is a partial cross sectional view taken along the line XII—XII shown in FIG. 11.
Figure 13:
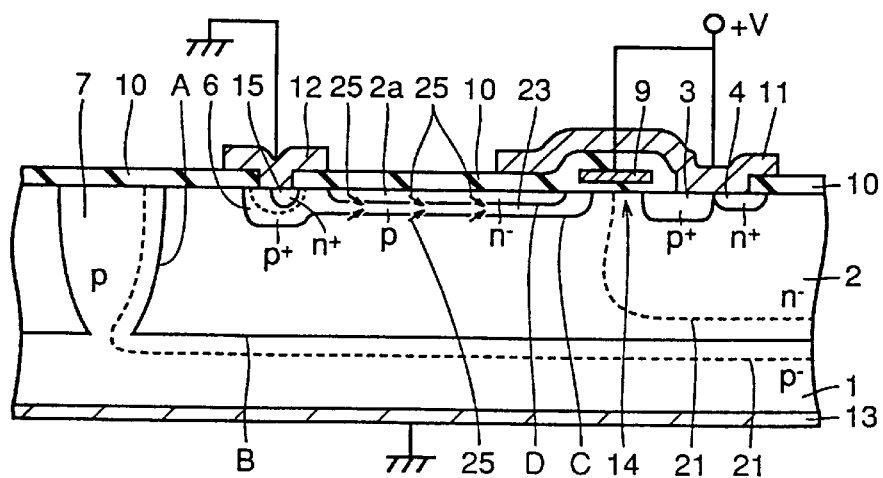
FIG. 13 shows a state of a depletion layer of the high withstand voltage semiconductor device shown in FIG. 11 at the time of off-operation.

Referring now to FIGS. 11–13, a fourth embodiment will be described. FIG. 11 is a partial cross sectional, perspective view of the fourth embodiment of the high withstand voltage semiconductor device according to the present invention.

Referring to FIG. 11, a p diffusion region 23 containing p-type impurity the concentration of which is higher than that of p-type impurity contained in p⁻ diffusion region 5 is formed, and an n⁻ diffusion region 2a is provide at a surface of p diffusion region 23. Furthermore, an n⁺ diffusion region 15 is formed on a surface of p⁺ diffusion region 6. Other than that structure, the device is almost the same as the high withstand voltage semiconductor device shown in FIG. 1.

With n⁻ diffusion region 2a provided on a surface of p diffusion region 23 as described above, a region in which modulation occurs by electron implantation is formed above and below p diffusion region 23 at the time of on-operation. This improves modulation efficiency and accelerates switching operation rate.

FIG. 12 shows a part of the cross section taken along the line XII—XII shown in FIG. 11. Referring to FIG. 12, p diffusion region 23 has a gap 31 at its side. Gap 31 allows formation of a region in which modulation occurs at the right and left sides of p diffusion region 23, as well as above and below p diffusion region 23. This further improves modulation efficiency. The gap 31 described above connects n⁻ diffusion region 2a with n⁻ layer 2.

Referring now to FIG. 13, off-operation of the fourth embodiment of the high withstand voltage semiconductor device will be described. FIG. 13 shows a state of a depletion layer of the fourth embodiment of the high withstand voltage semiconductor device at the time of off-operation.

Referring to FIG. 13, a predetermined voltage is applied under the same voltage applying conditions as is in the first embodiment described above. This allows expansion of a depletion layer from pn junctions A, B, C, D. Particularly, a portion of the depletion layer extending from pn junctions C, D grows such that it sandwiches p diffusion region 23 between upper and lower portions, as indicated by arrows 25 in FIG. 13. This promotes the depletion of p diffusion region 23, and the RESURF effect can be obtained effectively. This improves a withstand voltage of the high withstand voltage semiconductor device at the time of off-operation.

Furthermore, since the depletion of p diffusion region 23 is further promoted as described above, a p-type impurity concentration of p diffusion region 23 can be increased more than that of p⁻ diffusion region 5. This decreases a resistance value of the high withstand voltage semiconductor device at the time of on-operation.

[Fifth Embodiment]

Figure 14:
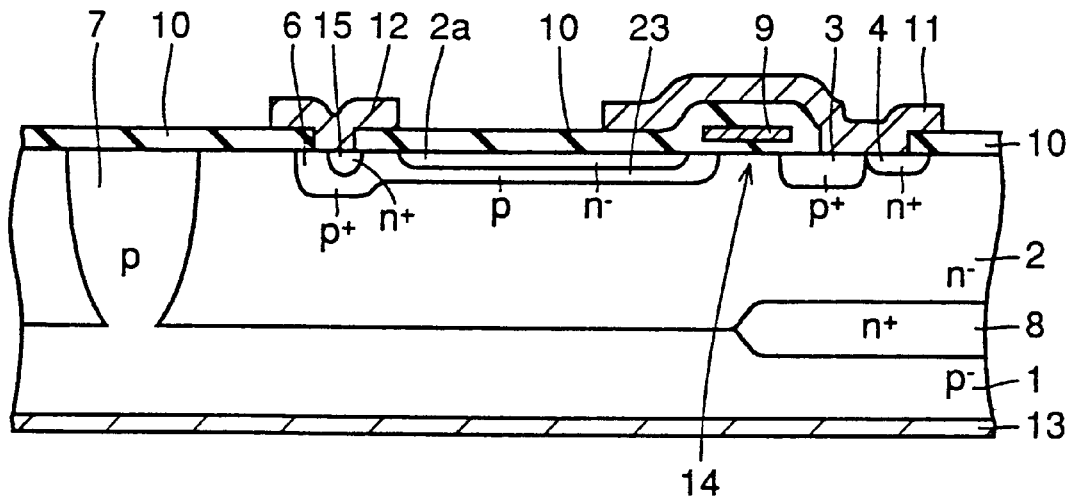
FIG. 14 is a partial cross sectional view of a fifth embodiment of the high withstand voltage semiconductor device according to the present invention.
Figure 15:
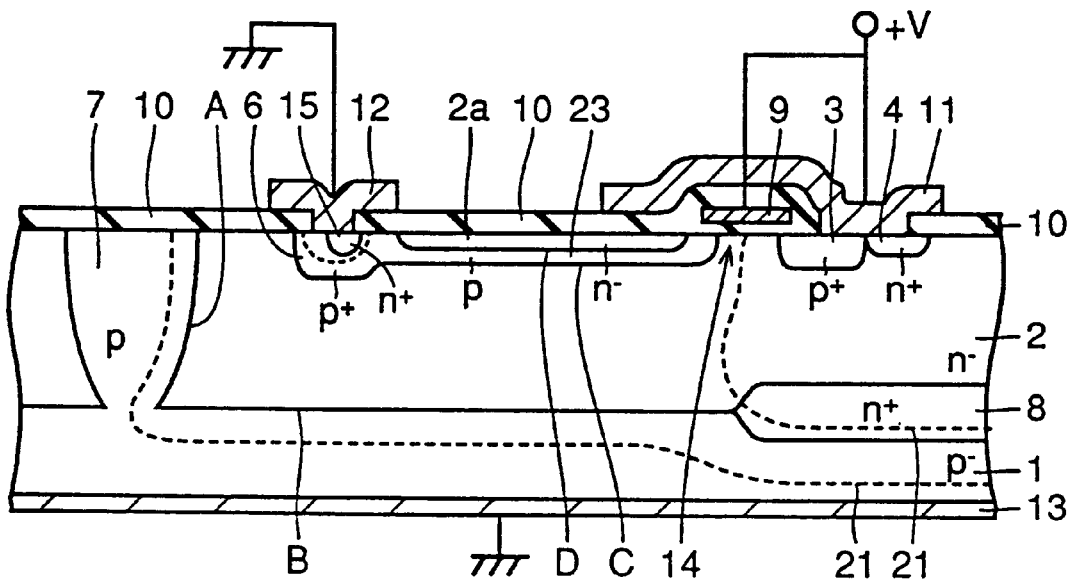
FIG. 15 shows a state of a depletion layer of the high withstand voltage semiconductor device shown in FIG. 14 at the time of off-operation.

Referring now to FIGS. 14 and 15, a fifth embodiment of the present invention will be described. FIG. 14 is a partial cross sectional view of the fifth embodiment of the high withstand voltage semiconductor device according to the present invention. More specifically, the figure shows an embodiment in which the present invention is applied to the IGBT. Referring to FIG. 14, the fifth embodiment of the high withstand voltage semiconductor device differs from the high withstand voltage semiconductor device shown in FIG. 1 in that n⁺ buried diffusion region 8 is formed.

By providing n⁺ buried diffusion region 8, it becomes possible to expand a depletion layer in p-type semiconductor substrate 1 positioned under n⁺ buried diffusion region 8 at the time of off-operation, as shown in FIG. 15. This further improves a withstand voltage of the high withstand voltage semiconductor device, as is in the second embodiment described above.

[Sixth Embodiment]

Figure 16:
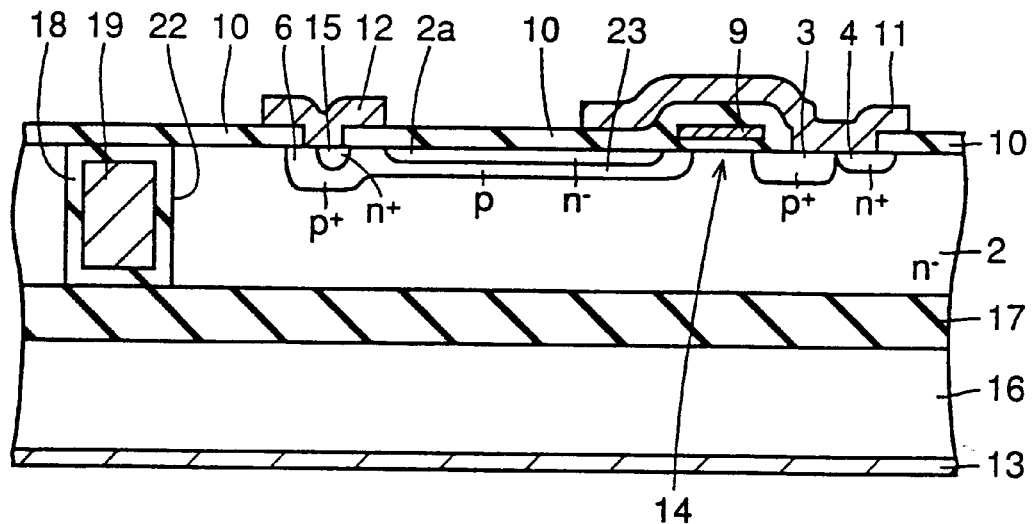
FIG. 16 is a partial cross sectional view of a sixth embodiment of the high withstand voltage semiconductor device according to the present invention.
Figure 17:
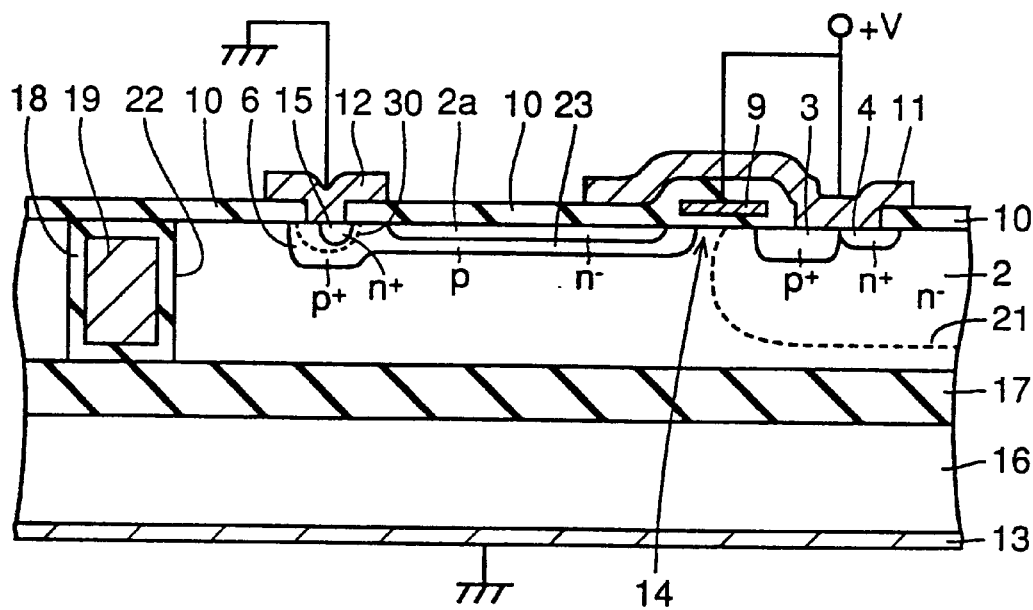
FIG. 17 shows a state of a depletion layer of the high withstand voltage semiconductor device shown in FIG. 16 at the time of off-operation.

Referring now to FIGS. 16 and 17, a sixth embodiment of the present invention will be described. FIG. 16 is a partial cross sectional view of the sixth embodiment of the high withstand voltage semiconductor device according to the present invention.

Referring to FIG. 16, n⁻ layer 2 is formed on a surface of p-type semiconductor substrate 16 with buried oxide film 17 interposed. Trench 22 is provided such that it penetrates n⁻ layer 2, and oxide film 18 and polysilicon layer 19 are buried in trench 22. Other than that structure, the device is the same as the high withstand voltage semiconductor device shown in FIG. 11.

In the sixth embodiment of the high withstand voltage semiconductor device also, it is possible to expand a depletion layer sufficiently in n⁻ layer 2 at the time of off-operation, as shown in FIG. 17. Thus, the same effect as is in the fourth embodiment described above can be obtained.

[Seventh Embodiment]

Figure 18:
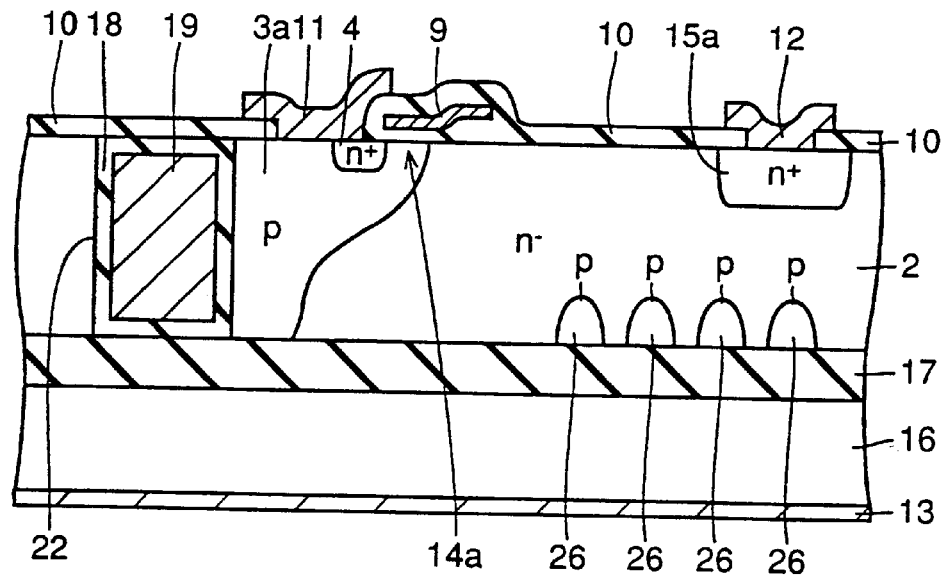
FIG. 18 is a partial cross sectional view of a seventh embodiment of the high withstand voltage semiconductor device according to the present invention.

Referring now to FIGS. 18–21, a seventh embodiment of the present invention will be described. FIG. 18 is a cross sectional view of the seventh embodiment of the high withstand voltage semiconductor device according to the present invention. More specifically, the figure shows an embodiment in which the present invention is applied to n-channel MOS device.

Referring to FIG. 18, buried oxide film 17 is formed on a surface of semiconductor substrate 16. N⁻ layer 2 is formed on buried oxide film 17. An n-channel MOS transistor 14a is formed at a surface of n⁻ layer 2. N-channel MOS transistor 14a consists of n⁺ diffusion region 4, gate electrode 9 and n⁻ layer 2. Furthermore, a p diffusion region 3a is formed in n⁻ layer 2.

An n⁺ diffusion region 15a is formed such that it is spaced apart from p diffusion region 3a. Drain electrode 12 is formed in contact with a surface of n⁺ diffusion region 15a, and source electrode 11 is formed in contact with a surface of p diffusion region 3a and a surface of n⁺ diffusion region 4.

Trench 22 is formed such that it penetrates n⁻ layer 2 to reach buried oxide film 17, and oxide film 18 and polysilicon layer 19 are buried in trench 22. Furthermore, a p diffusion region 26 is formed at a bottom region of n⁻ layer 2 positioned between p diffusion region 3a and n⁺ diffusion region 15a such that p diffusion region 26 is adjacent to buried oxide film 17.

A plurality of p diffusion regions 26 may be provided such that they are spaced apart from one another, as shown in FIG. 18, or the adjacent p diffusion regions 26 may be connected to each other by, for example, a p-type low concentration region. Furthermore, a p-type impurity concentration contained in p diffusion region 26 may be the same as or more than a p-type impurity concentration contained in diffusion region 3a. Preferably, the p-type impurity concentration contained in p diffusion region 26 is approximately 10–100 times the p-type impurity concentration contained in p diffusion region 3a.

Figure 19:
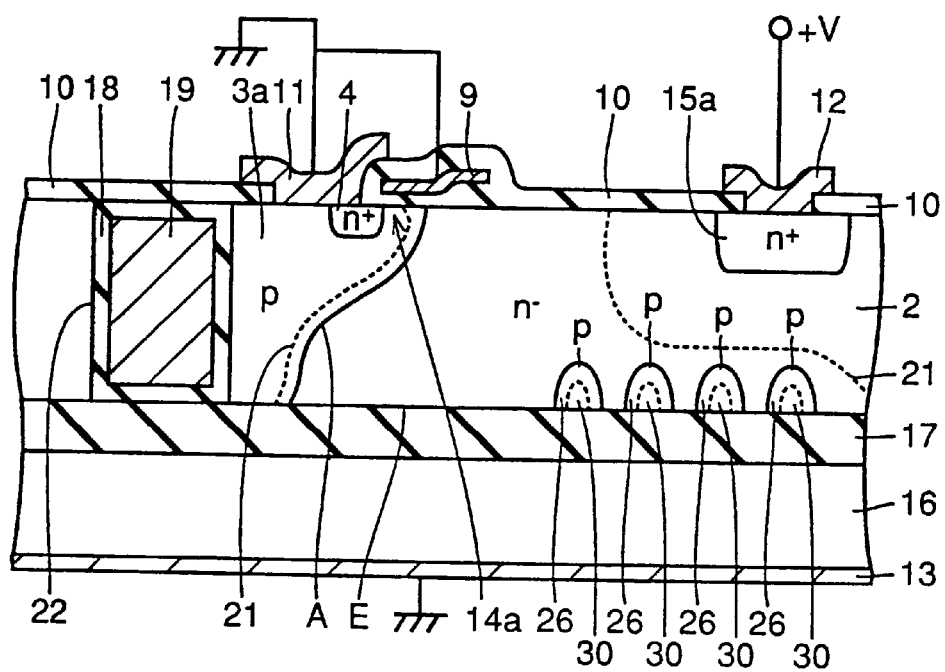
FIG. 19 shows a state of a depletion layer of the high withstand voltage semiconductor device shown in FIG. 18 at the time of off-operation.

The reason why a withstand voltage of the high withstand voltage semiconductor device at the time of off-operation can be improved by forming the p diffusion region 26 described above will be described hereinafter. FIG. 19 shows a state of a depletion layer in the seventh embodiment of the high withstand voltage semiconductor device at the time of off-operation. As shown in FIG. 19, in order to put the seventh embodiment of the high withstand voltage semiconductor device in off-state, electric potentials of source electrode 11, gate electrode 9 and substrate electrode 13 are set to be 0V and a positive electric potential (+V) is applied to drain electrode 12. This allows a depletion layer to extend from pn junction A and an interface E.

As shown in FIG. 19, by providing p diffusion region 26 at the bottom of n⁻ layer 2 positioned between p diffusion region 3a and n⁺ diffusion region 15a, p diffusion region 26 will have a function to promote the widening of the depletion layer in the horizontal direction. Furthermore, by providing a plurality of p diffusion regions 26 towards the bottom region of n⁻ layer 2 positioned directly under drain electrode 12, the function to promote the widening of the depletion layer in the horizontal direction will further be improved.

Thus, the widening of the depletion layer is promoted in the horizontal direction and the RESURF effect is obtained effectively. As a result, a withstand voltage of the high withstand voltage semiconductor device at the time of off-operation can be improved. Furthermore, as p diffusion region 26 is provided, it becomes possible to widen the range of the value of various parameters related to the determination of withstand voltage in which a certain constant withstand voltage is maintained.

Figure 20:
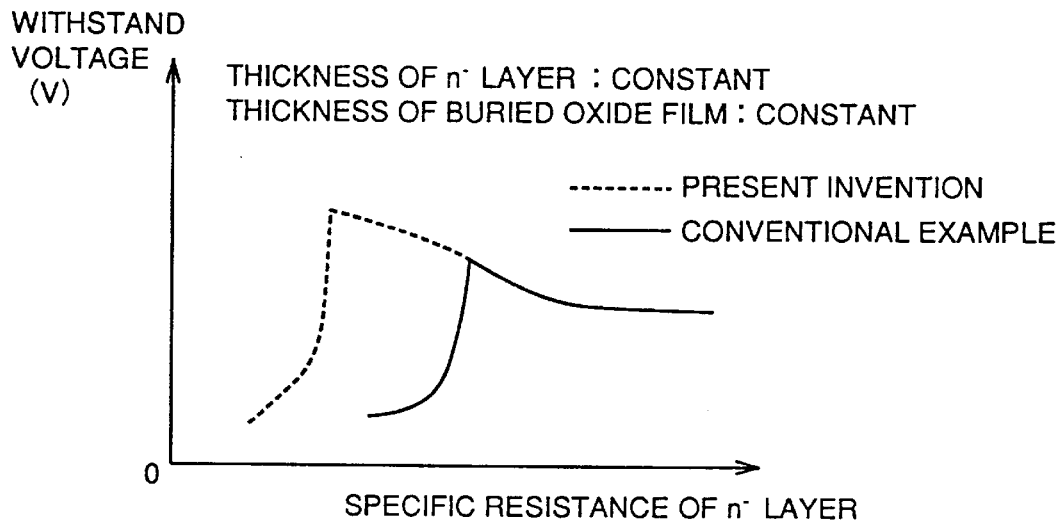
FIG. 20 shows the relation between the specific resistance of n$^-$ layer and the withstand voltage of the high withstand voltage semiconductor device.

FIG. 20 shows change in withstand voltage of the high withstand voltage semiconductor devices relative to the specific resistance of n⁻ layer 2. In FIG. 20, the characteristic of a conventional example is indicated with the solid line. FIG. 20 shows a tendency that the withstand voltage slightly increases with decreased specific resistance of n⁻ layer 2 and then the withstand voltage rapidly decreases.

This tendency is caused by an electric field concentration due to constraint of the widening of the depletion layer in the horizontal direction, as described, for example, in *Electronic Device for Increasing Withstand Voltage of SOI Separation Structure*, Semiconductor Electric Power Conversion Joint Research Society, EDD-92-106 (SPC-92-72) pp. 1–6, 1992. On the other hand, by providing p diffusion region 26, the characteristic shifts to the one shown with the dotted line in FIG. 20. In other words, that region in which the withstand voltage can be maintained at a lower specific resistance is expanded. Thus, it is possible to decrease the specific resistance of n⁻ layer 2 as compared with that of a conventional n⁻ layer and to reduce device resistance while maintaining a high withstand voltage.

Figure 21:
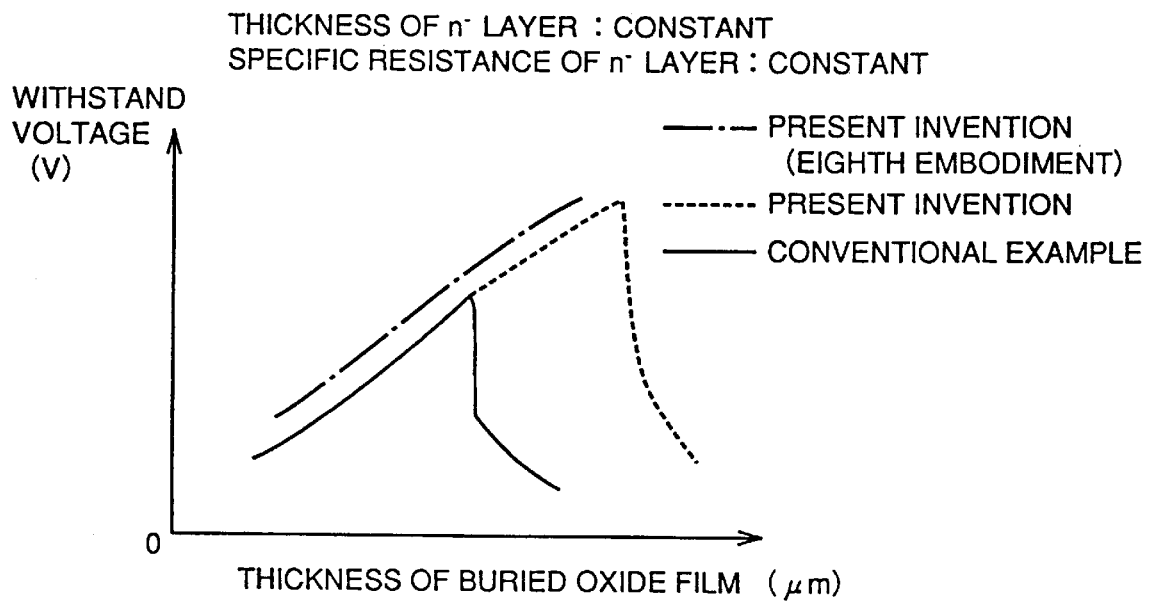
FIG. 21 shows the relation between the thickness of the buried oxide film and the withstand voltage of the high withstand voltage semiconductor device.

FIG. 21 shows change in withstand voltage of the high withstand voltage semiconductor device relative to the thickness of the buried oxide film. In FIG. 21, the solid line indicates the characteristic of a conventional example. Although the withstand voltage increases with increased thickness of the buried oxide film, the withstand voltage rapidly decreases when the thickness of the buried oxide film reaches a certain value. This tendency is attributed to a constraint on the widening of the depletion layer expanding from interface E into n⁻ layer 2 in FIG. 19. By contrast, the characteristic changes to the one indicated with the dotted line in FIG. 21 when forming p diffusion region 26 is performed. In other words, even if the thickness of buried oxide film 17 increases more than the certain value, a high withstand voltage can be maintained. Accordingly, it becomes possible to design devices with sufficient margins in thickness and specific resistance of n⁻ layer 2, and a device can be easily manufactured which takes into consideration the decrease in the device resistance and rapid switching.

[Eighth Embodiment]

Figure 22:
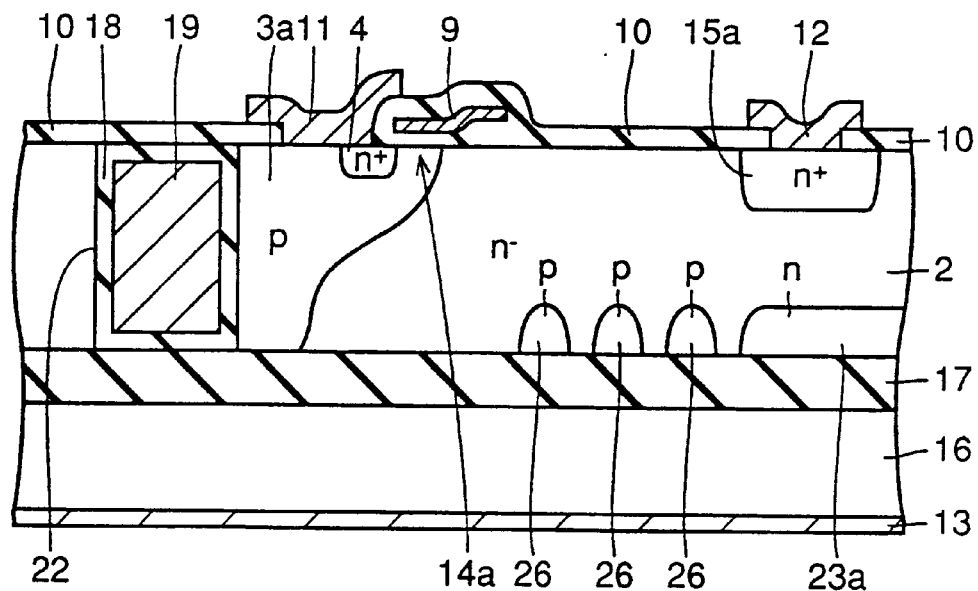
FIG. 22 is a partial cross sectional view of an eighth eighth embodiment of the high withstand voltage semiconductor device according to the present invention.
Figure 23:
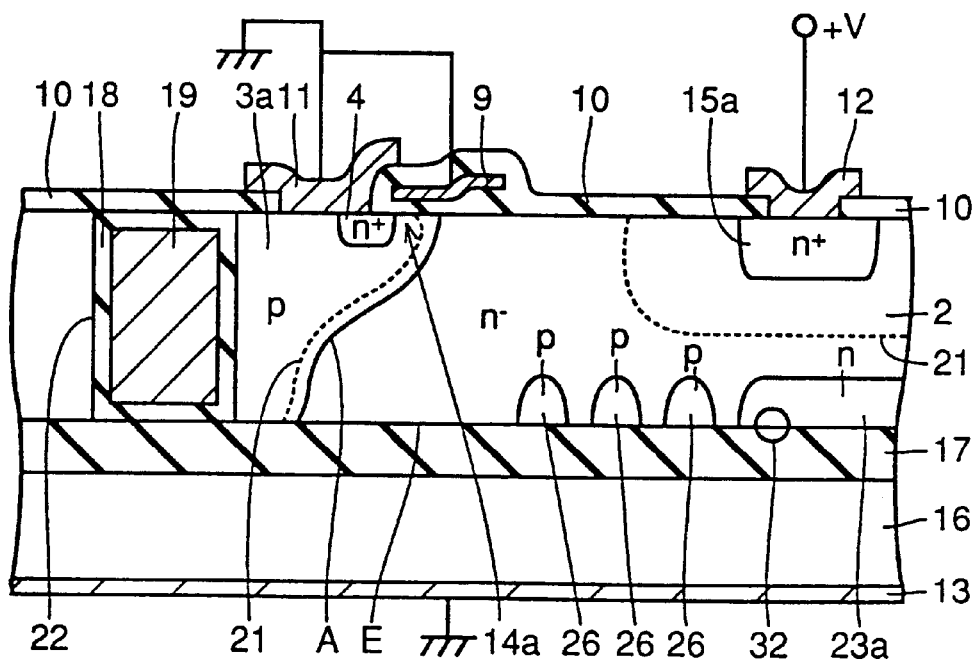
FIG. 23 shows a state of a depletion layer of the high withstand voltage semiconductor device shown in FIG. 22 at the time of off-operation.

Referring now to FIGS. 22 and 23, an eighth embodiment of the present invention will be described. FIG. 22 is a partial cross sectional view of the eighth embodiment of the high withstand voltage semiconductor device according to the present invention. Referring to FIG. 22, the device differs from the high withstand voltage semiconductor device shown in FIG. 18 in that an n diffusion region 23a is formed at a bottom region of n⁻ layer 2 positioned directly under n⁺ diffusion region 15a. Other than that structure, the device is the same as the high withstand voltage semiconductor device shown in FIG. 18.

As n diffusion region 23a is formed as described above, the effect described below will be obtained. The effect will be described with reference to FIG. 23. FIG. 23 shows a state of a depletion layer in the high withstand voltage semiconductor device shown in FIG. 22 at the time of off-operation.

Referring to FIG. 23, off-state is implemented under the same conditions as in the case of the seventh embodiment described above. As shown in FIG. 23, by applying a predetermined electric potential to each electrode, a depletion layer starts to extend from pn junction A and interface E. Then, the widening of the depletion layer is promoted in the horizontal direction due to the presence of p diffusion region 26. Accordingly, the RESURF effect is obtained effectively.

In this case, various parameters such as dimension is controlled so that electric field concentration point 32 is positioned at interface E of n diffusion region 23a. This provides the characteristic indicated with the chained line in FIG. 21. This reflects an influence due to an increased electric field strength at which avalanche breakdown occurs and is described, for example, in *High Voltage Device*

Structures for Trench Isolated SOI Power ICs, a material of The Research Society of the Institute of Electronics EDD-92-68, pp. 69–74, 1992. By applying such a structure, a withstand voltage of the device can further be increased as compared with the case of the seventh embodiment.

[Ninth Embodiment]

Figure 24:
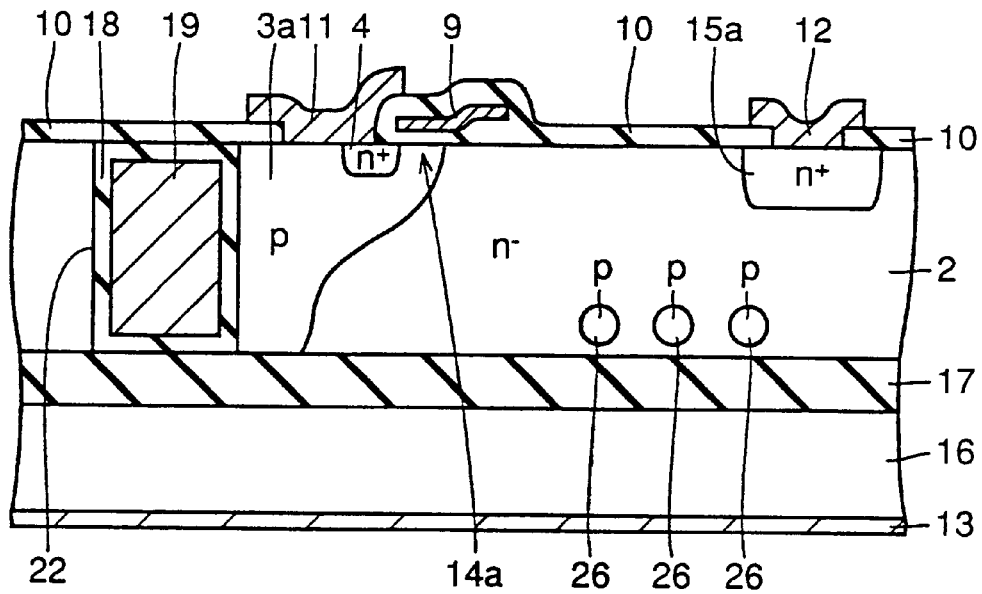
FIG. 24 is a partial cross sectional view of a ninth embodiment of the high withstand voltage semiconductor device according to the present invention.
Figure 25:
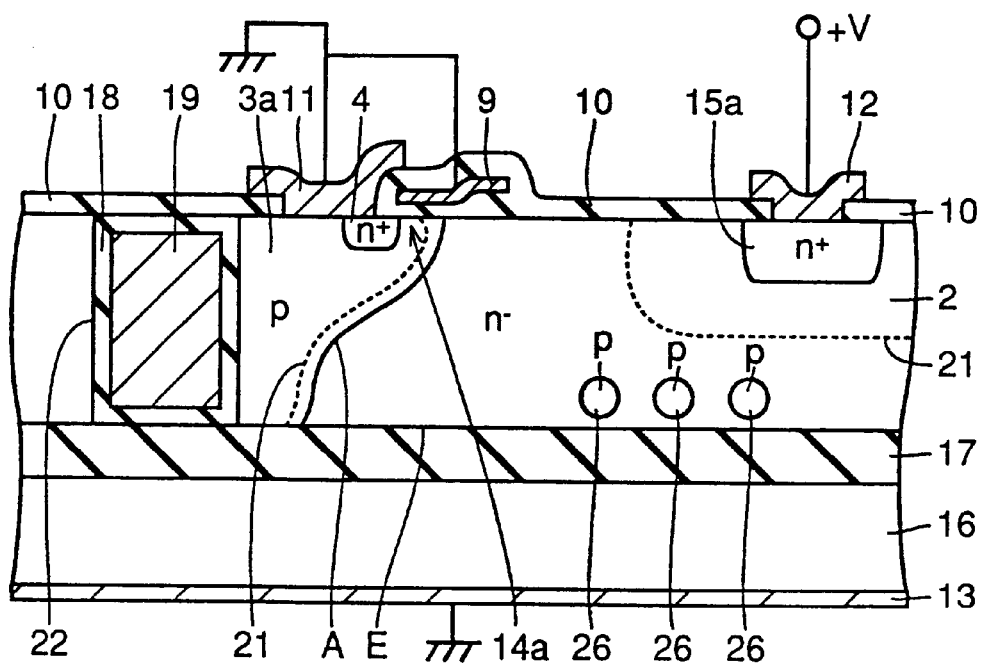
FIG. 25 shows a state of a depletion layer of the high withstand voltage semiconductor device shown in FIG. 24 at the time of off-operation.

Referring now to FIGS. 24 and 25, a ninth embodiment of the present invention will be described. FIG. 24 is a partial cross sectional view of the ninth embodiment of the high withstand voltage semiconductor device of the present invention.

Referring to FIG. 24, in the ninth embodiment, p diffusion region 26 is formed such that it is spaced apart from an interface of buried oxide film 17 and n⁻ layer 2. Other than that structure, the device is the same as the high withstand voltage semiconductor device shown in FIG. 18.

In the case in which p diffusion region 26 is formed as described above also, the same effect as the case of the seventh embodiment described above is obtained. FIG. 25 shows a state of a depletion layer in the ninth embodiment of the high withstand voltage semiconductor device shown in FIG. 24 at the time of off-operation. As shown in FIG. 25, the depletion layer can be sufficiently widened in the horizontal direction and the RESURF effect can be obtained effectively.

[Tenth Embodiment]

Figure 26:
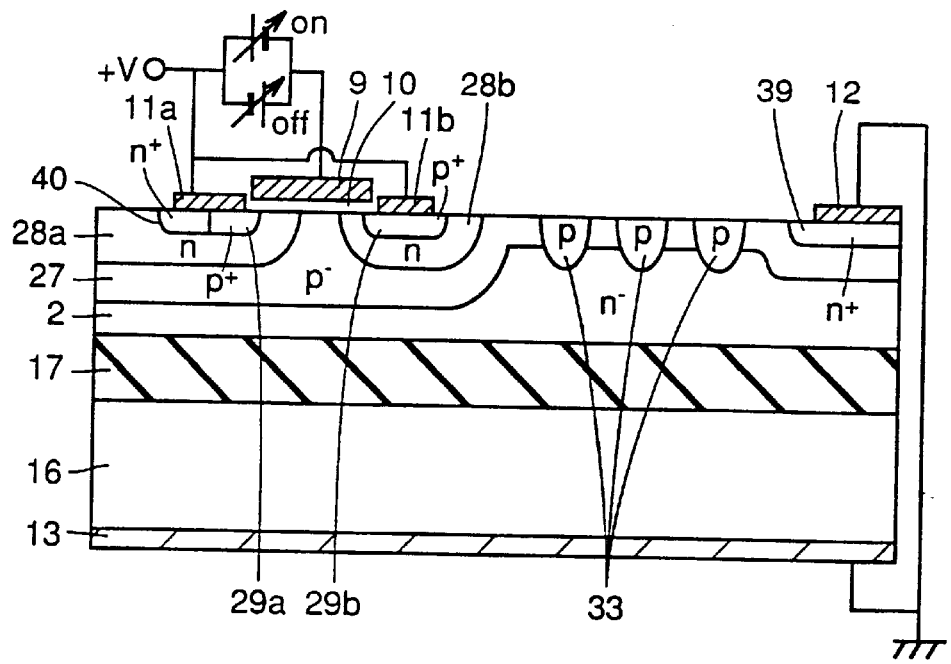
FIG. 26 is a partial cross sectional view of a tenth embodiment of the high withstand voltage semiconductor device according to the present invention.

Referring now to FIG. 26, a tenth embodiment of the present invention will be described. FIG. 26 is a partial cross sectional view of the tenth embodiment of the high withstand voltage semiconductor device according to the present invention. More specifically, the figure shows an embodiment in which the concept of the present invention is applied to a p-channel EST.

Referring to FIG. 26, n⁻ layer 2 is formed on a surface of semiconductor substrate 16 with buried oxide film 17 interposed. A p⁻ diffusion region 27 is formed on a surface of n⁻ layer 2. N diffusion regions 28a, 28b and on n⁺ diffusion region 39 are provided such that they are spaced apart from each another at a surface of p⁻ diffusion region 27. An n⁺ diffusion region 40 and a p⁺ diffusion region 29a are formed on a surface of n diffusion region 28a.

A source electrode 11a is formed in contact with both n⁺ diffusion region 40 and p⁺ diffusion region 29a, and a source electrode 11b is formed in contact with a p⁺ diffusion region 29b. Furthermore, gate electrode 9 is formed on a surface of p⁻ diffusion region 27 positioned between n diffusion region 28a and n diffusion region 28b with oxide film 10 interposed. Furthermore, drain electrode 12 is formed in contact with a surface of n⁺ diffusion region 39.

In this structure, a p diffusion region 33 is provided at p⁻ diffusion region 27 positioned between n diffusion region 28b and n⁺ diffusion region 39. Preferably, a p-type impurity concentration contained in p diffusion region 33 is more than approximately 10–100 times p-type impurity concentration contained in p⁻ diffusion region 27. Furthermore, it is preferable that a plurality of p diffusion regions 33 be provided such that they are spaced apart from one another.

Thus, similar to the cases of the first to third embodiments described above, the widening of the depletion layer in the horizontal direction at the time of off-operation can be effectively promoted. Furthermore, as the concentration of p diffusion region 33 is relatively higher than that of p⁻ diffusion region 27, a resistance of a current path at the time of on-operation can also be decreased. This decreases the device resistance.

[Eleventh Embodiment]

Figure 27:
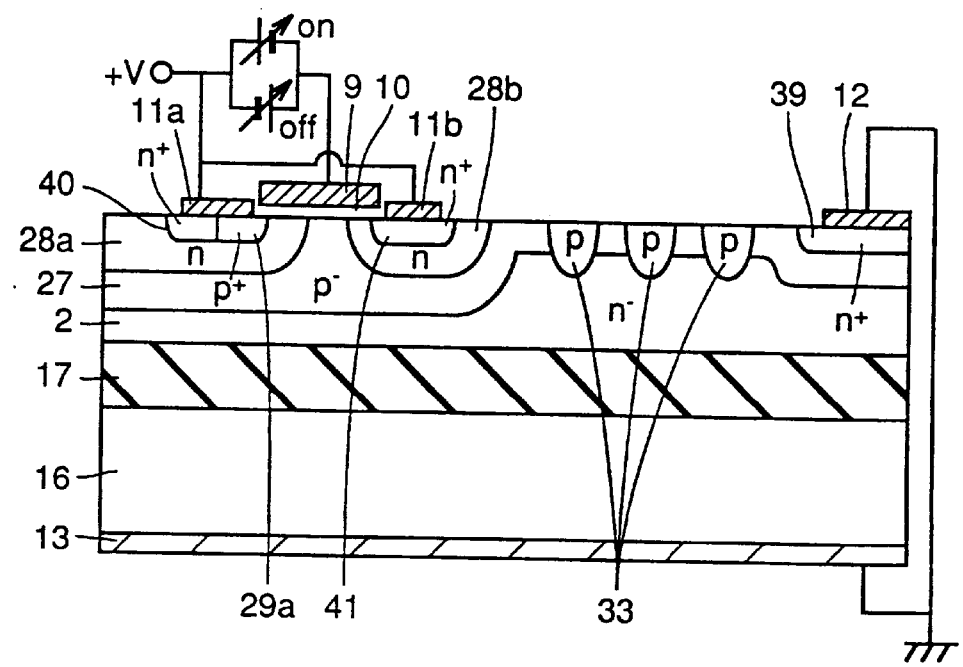
FIG. 27 is a partial cross sectional view of a eleventh embodiment of the high withstand voltage semiconductor device according to the present invention.

Referring now to FIG. 27, an eleventh embodiment of the present invention will be described. FIG. 11 is a cross sectional view of the eleventh embodiment of the high withstand voltage semiconductor device according to the present invention. Referring to FIG. 27, the eleventh embodiment of the high withstand voltage semiconductor device differs from the tenth embodiment of the high withstand voltage semiconductor device shown in FIG. 26 in that an n⁺ diffusion region 41 is formed in place of p⁺ diffusion region 29b. Other than that structure, the device is the same as the tenth embodiment of the high withstand voltage semiconductor device described above.

In other words, the eleventh embodiment illustrates a high withstand voltage semiconductor device in which the concept of the present invention is applied to a p-channel BRT. In this case also, the same effect as the case of the tenth embodiment described above will be obtained.

Referring now to FIGS. 28–32, a modification of p diffusion region 20 will be described.

(First Modification)

Figure 28:
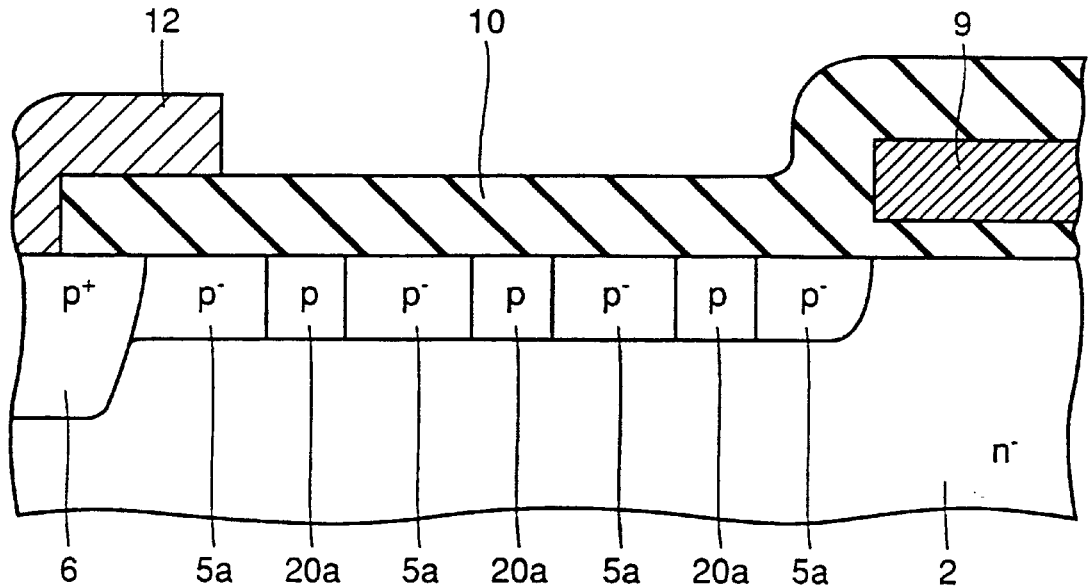
FIG. 28 is a cross sectional view of a first modification of the arrangement of p diffusion region 20 according to the present invention.

Referring firstly to FIG. 28, a first modification will be described. FIG. 28 is a partially enlarged cross sectional view of the first modification of p diffusion region 20. Referring to FIG. 28, a p diffusion region 20a and a p⁻ diffusion region 5a are arranged alternately, a diffusion depth of each being almost the same. In this structure also, almost the same effect as the case shown in FIG. 1 is obtained.

(Second Modification)

Figure 29:
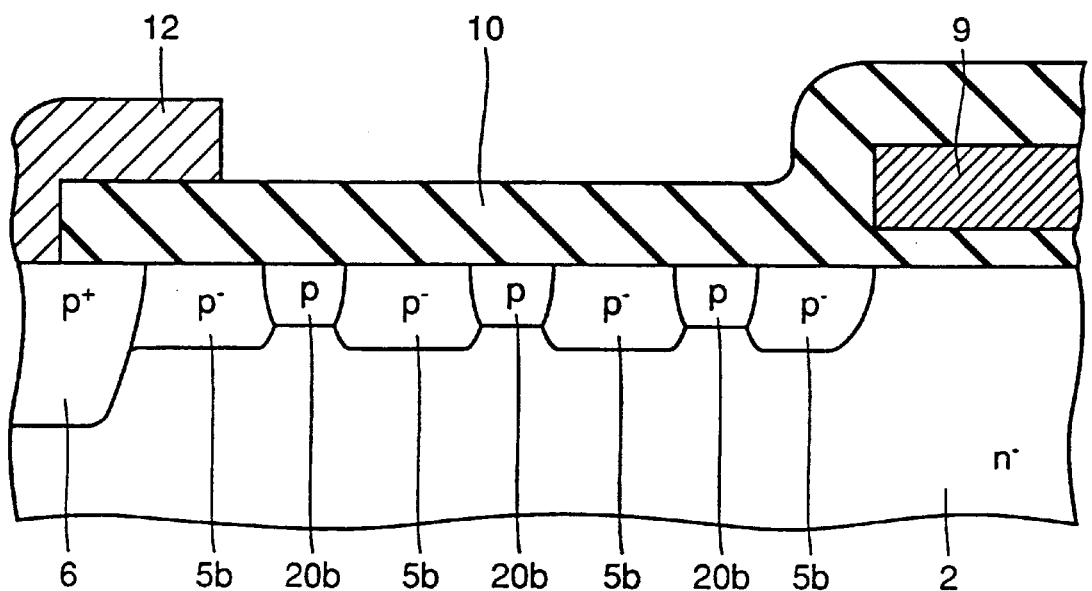
FIG. 29 is a cross sectional view of a second modification of the arrangement of p diffusion region 20 according to the present invention.

Referring now to FIG. 29, a second modification will be described. FIG. 29 is a partially enlarged cross sectional view of the second modification of p diffusion region 20.

Referring to FIG. 29, the diffusion depth of a p diffusion region 20b is made shallower than the diffusion depth of a p⁻ diffusion region 5b. This further promotes the widening of the depletion layer in the horizontal direction when compared with the case shown in FIG. 1.

(Third Modification)

Figure 30:
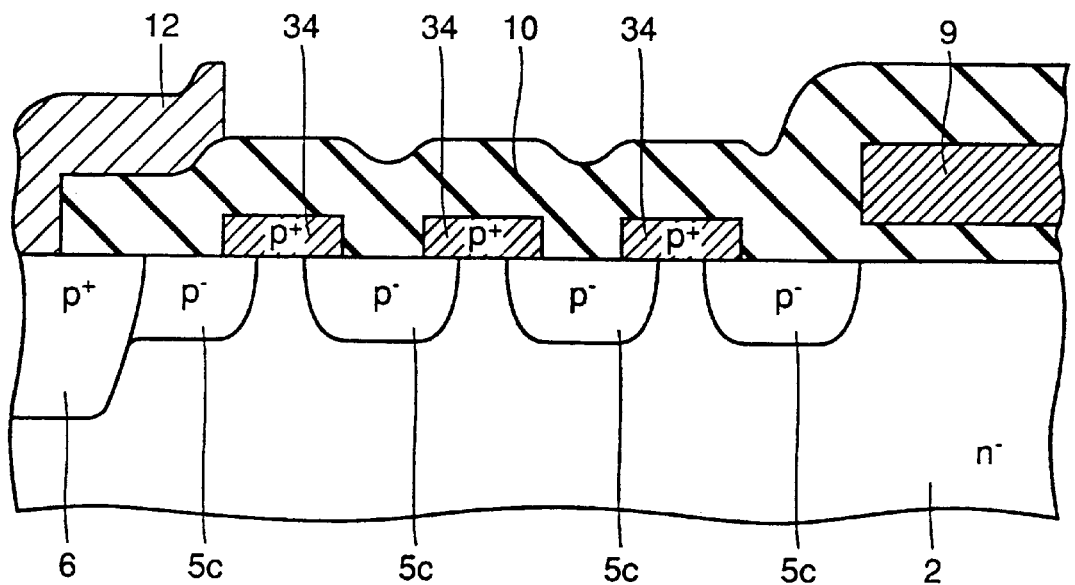
FIG. 30 is a cross sectional view of a third modification of the arrangement of p diffusion region 20 according to the present invention.

Referring now to FIG. 30, a third modification of p diffusion region 20 will be described. FIG. 30 is a partially enlarged cross sectional view of the third modification of p diffusion region 20.

Referring to FIG. 30, in place of p diffusion region 20 shown in FIG. 1, a polysilicon layer 34 introducing a high concentration p-type impurity may be formed on a surface of n⁻ layer 2. At that time, a plurality of p⁻ layers 5c are formed on a surface of n⁻ layer 2 such that they are spaced apart from one another, the adjacent p⁻ diffusion regions 5c being electrically connected by polysilicon layer 34. In this structure also, the same effect as the case shown in FIG. 1 is obtained. In the present modification, the concentration of polysilicon layer 34 can be rendered extremely high, further decreasing device resistance at the time of on-operation when compared with the case of the first embodiment shown in FIG. 1.

(Fourth Modification)

Figure 31:
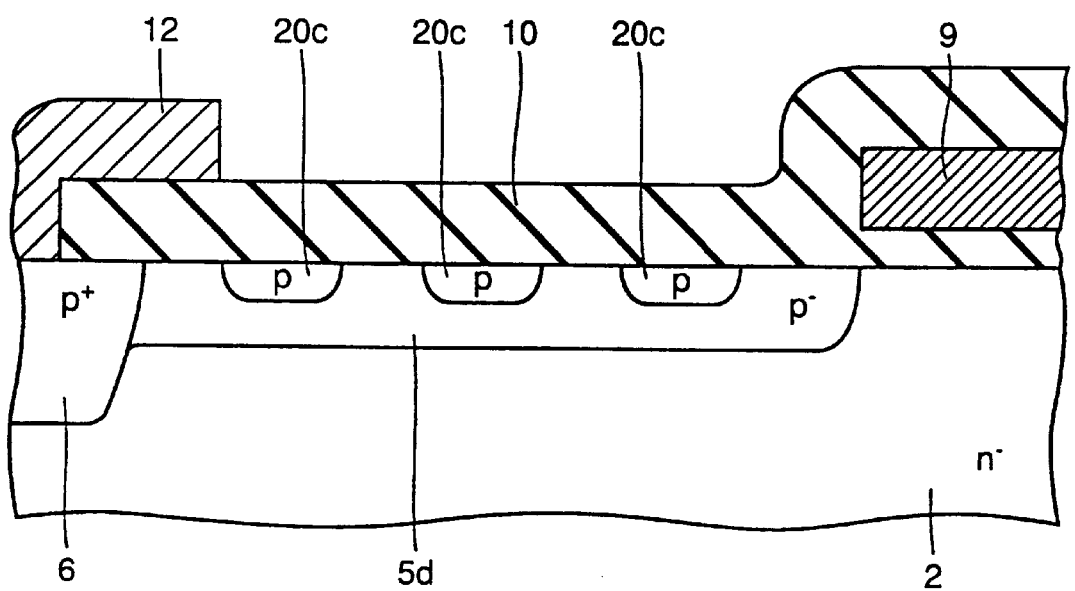
FIG. 31 is a cross sectional view of a fourth modification of the arrangement of p diffusion region 20 according to the present invention.

Referring now to FIG. 31, a fourth modification of p diffusion region 20 will be described. FIG. 31 is a partially enlarged cross sectional view of the fourth modification of p diffusion region 20.

Referring to FIG. 31, in the present modification, a plurality of p diffusion regions 20c are provided on the surface of a p⁻ diffusion region 5d such that they are spaced apart from one another. In this structure also, the same effect as the case of the first embodiment shown in FIG. 1 will be obtained.

(Fifth Modification)

Figure 32:
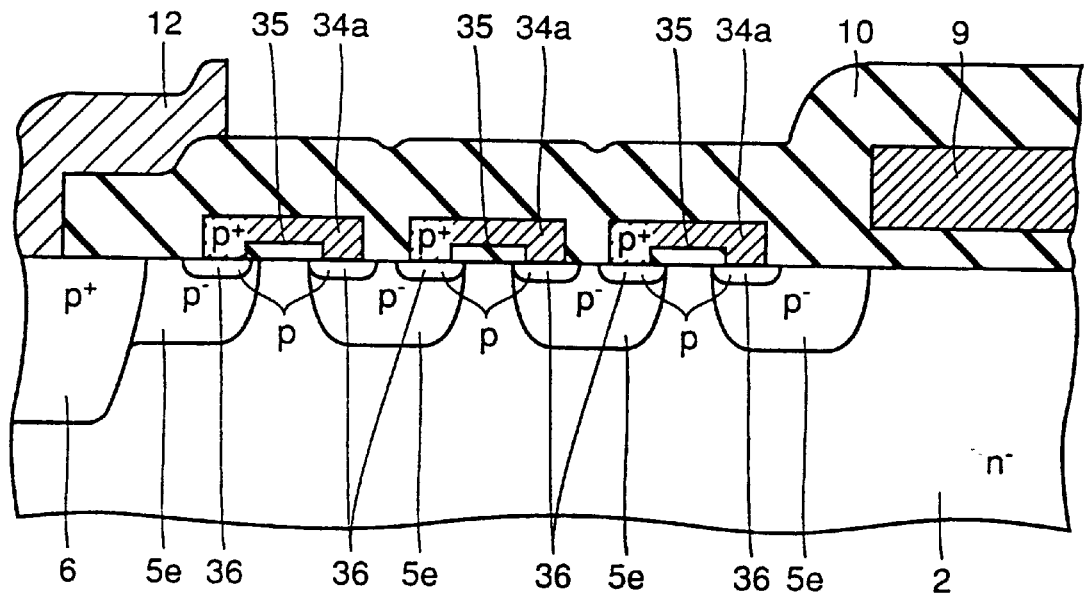
FIG. 32 is a cross sectional view of a fifth modification of the arrangement of p diffusion region 20 according to the present invention.

Referring now to FIG. 32, a fifth modification of p diffusion region 20 will be described. FIG. 32 is a partially enlarged cross sectional view of the fifth modification of p diffusion region 20.

Referring to FIG. 32, in the present modification, a polysilicon layer 34a is formed on a surface of n⁻ layer 2 with an insulating layer 35 interposed. Furthermore, a p⁺ diffusion region 36 is formed such that it surrounds a contact portion of polysilicon layer 34a and a p⁻ diffusion region 5e. Other than that structure, the present modification is the same as the third modification described above. In the present modification also, almost the same effect as the case of the third modification described above is obtained.

Referring now to FIGS. 33–39, a method of manufacturing polysilicon layer 34a and p⁻ diffusion region 5e in FIG. 32 will be described.

Figure 33:
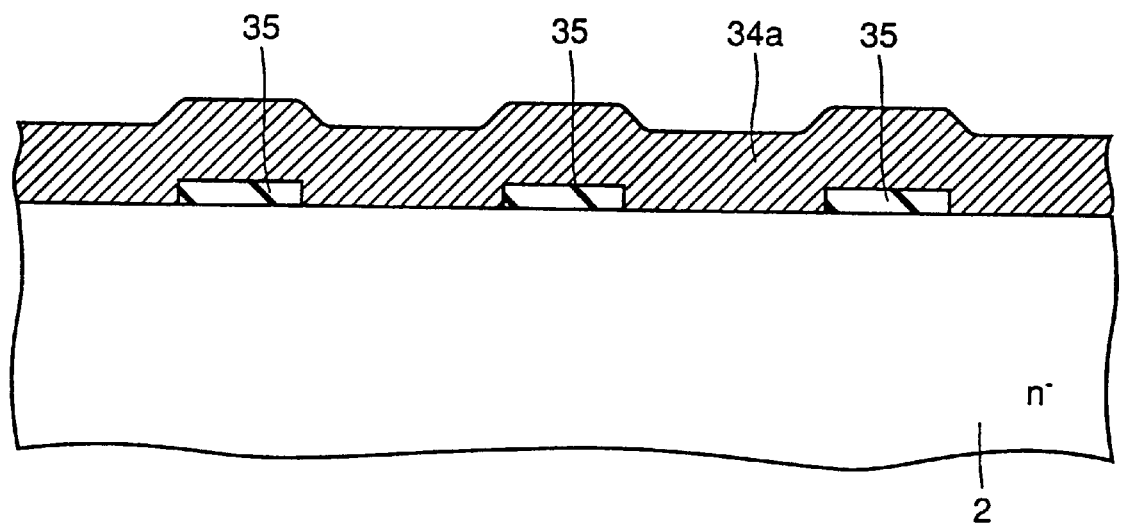
FIGS. 33–35 are cross sectional views illustrating the first to third steps of a first method of forming polysilicon layer 34a and p⁻ diffusion region 5e shown in FIG. 32.
Figure 34:
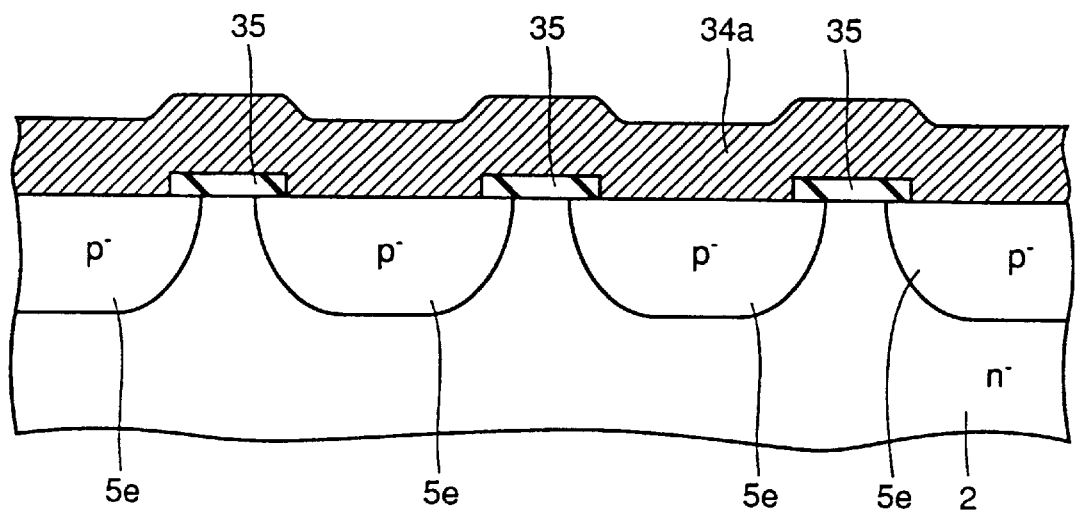
Figure 35:
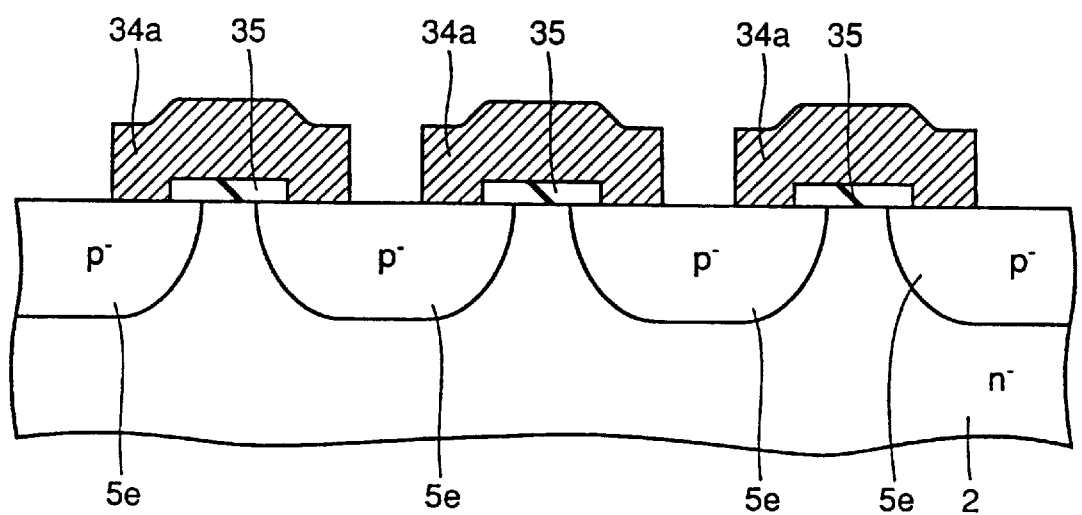

Referring firstly to FIGS. 33–35, a first manufacturing method will be described. Referring to FIG. 33, insulating layer 35 of silicon oxide film, for example, is deposited on a surface of n⁻ layer 2 using the CVD method. Then, after insulating layer 35 is patterned to a predetermined pattern, polysilicon layer 34a introducing a high concentration p-type impurity is formed using the CVD method, for example, such that it covers insulating layer 35 and a surface of n⁻ layer 2.

Referring now to FIG. 34, by heat treatment of polysilicon layer 34a, the p-type impurity contained in polysilicon layer 34a is diffused to a surface of n⁻ layer 2. Thus, p⁻ diffusion regions 5e are formed such that they are spaced apart from one another.

Referring now to FIG. 35, polysilicon layer 34a is patterned to a predetermined pattern. Through the process described above, polysilicon layer 34a and p⁻ diffusion region 5e shown in FIG. 32 are formed.

Figure 36:
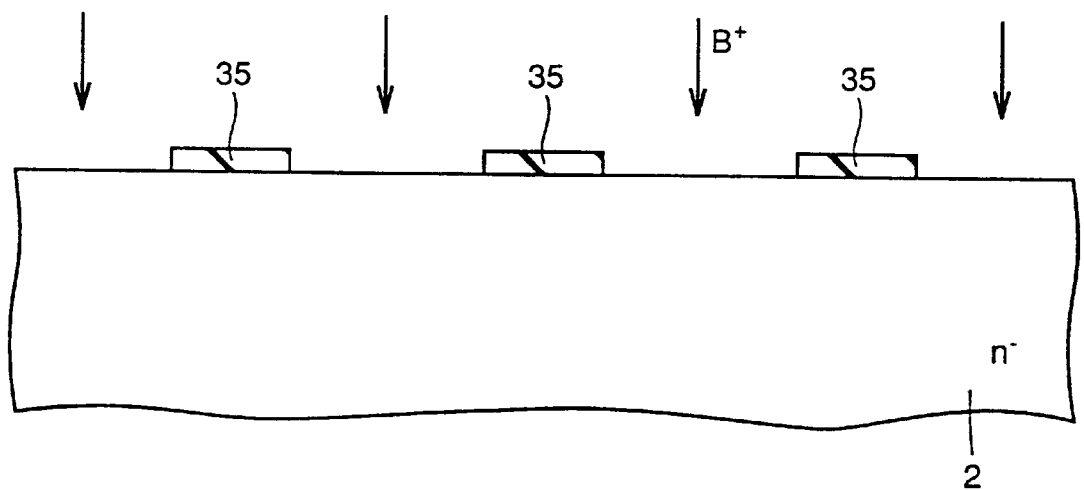
FIGS. 36–39 are cross sectional views illustrating the first to fourth steps of a second method of forming polysilicon layer 34a and p⁻ diffusion region 5e shown in FIG. 32.
Figure 37:
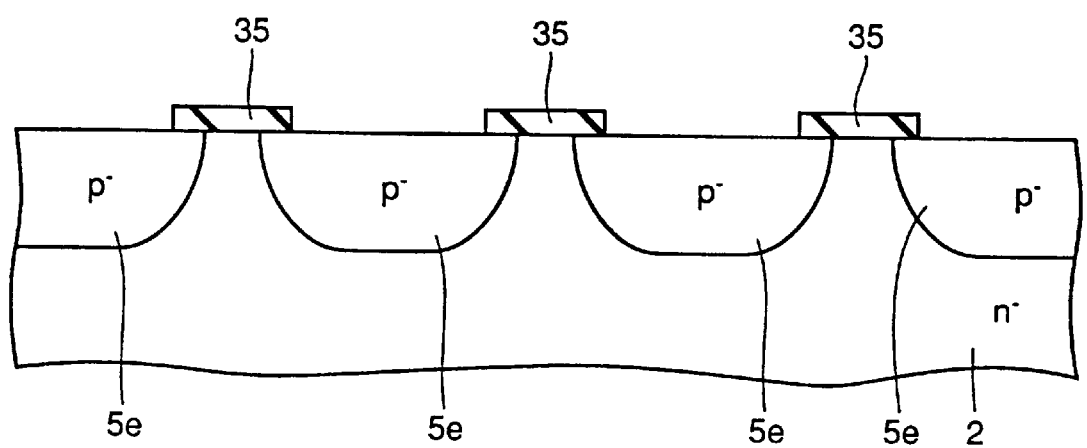

Referring now to FIGS. 36–39, a second method of manufacturing polysilicon layer 34a and p⁻ diffusion region 5e will be described. Referring firstly to FIG. 36, after the insulating layer 35 is formed through the same process as described in the case of the first manufacturing method described above, a p-type impurity such as boron ion (B⁺) is selectively implanted at a surface of n⁻ layer 2 by using insulating layer 35 as a mask. Then, by diffusion treatment of the implanted p-type impurity, p⁻ diffusion regions 5e are formed such that they are spaced apart from one another, as shown in FIG. 37.

Figure 38:
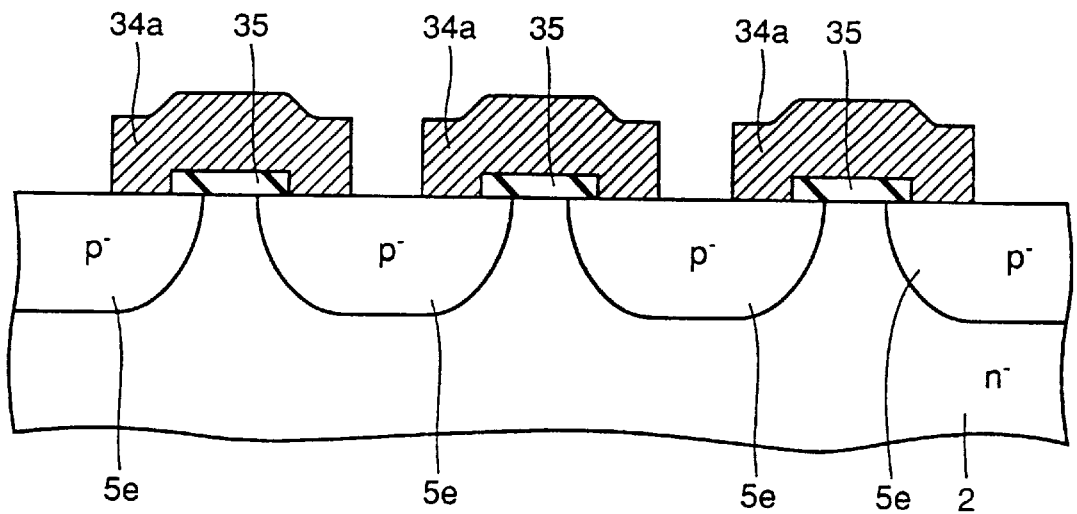
Figure 39:
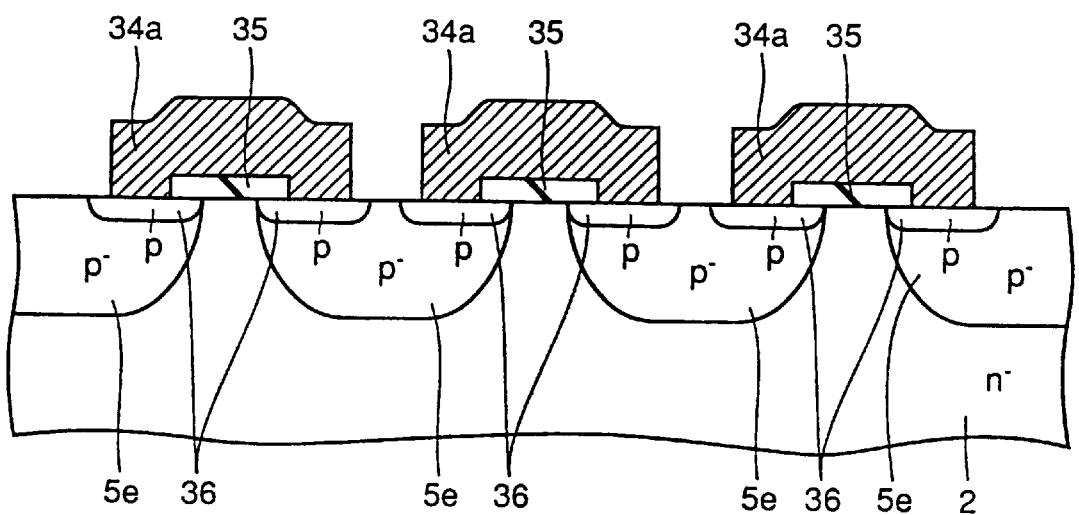
Figure 40:
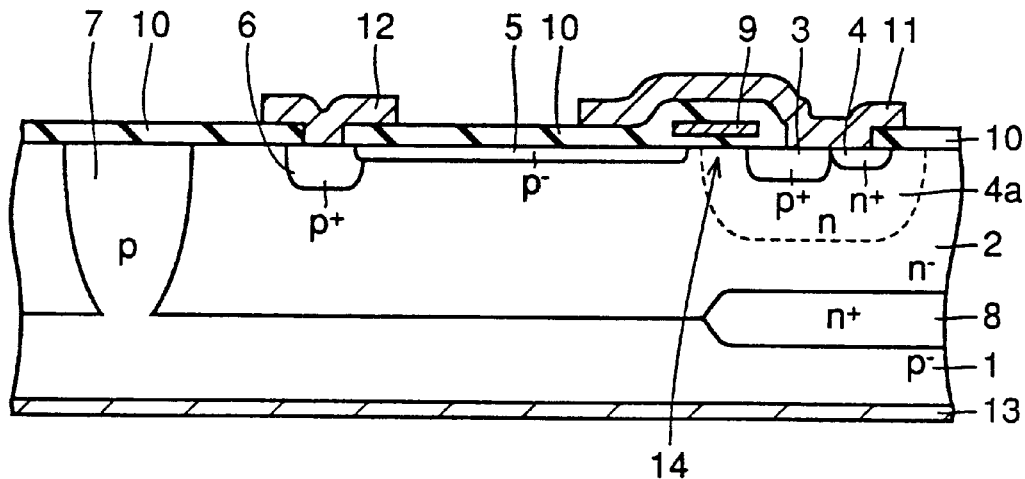
FIG. 40 is a cross sectional view of a first example of a conventional high withstand voltage semiconductor device.
Figure 41:
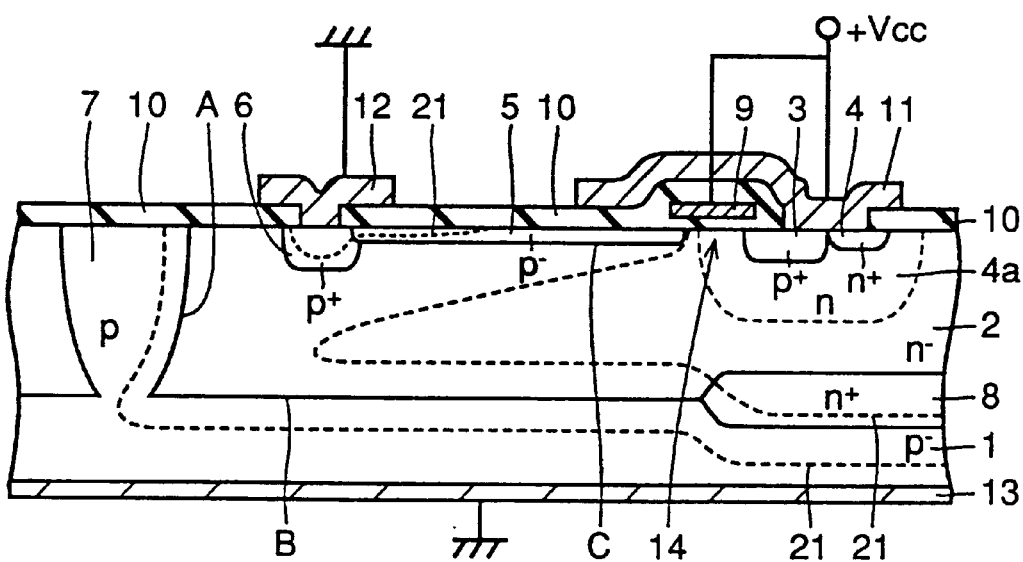
FIG. 41 shows a state of a depletion layer of the conventional high withstand voltage semiconductor device shown in FIG. 40 at the time of off-operation.
Figure 42:
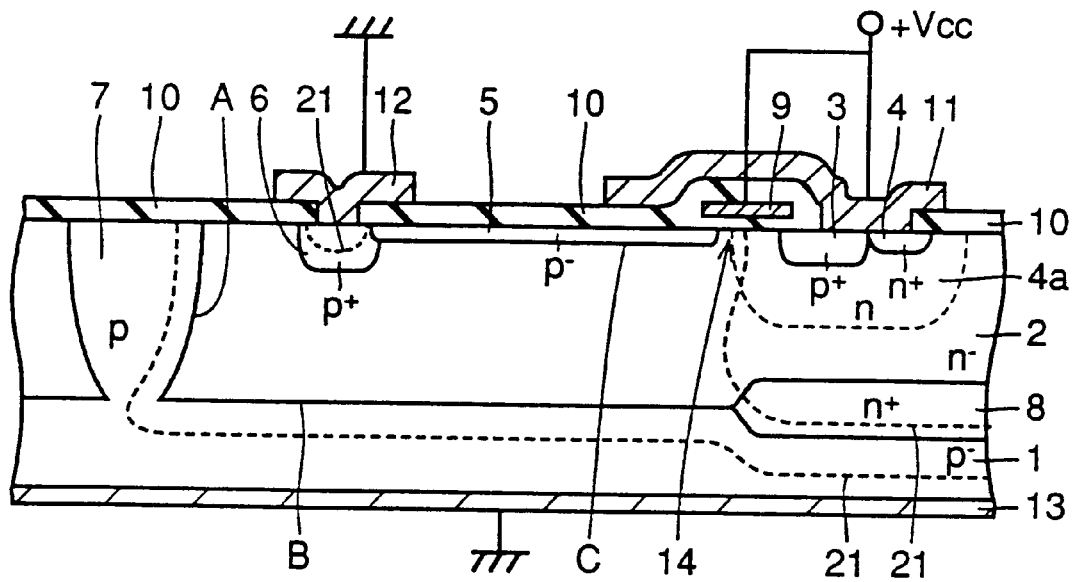
FIG. 42 shows a state of a depletion layer of the high withstand voltage semiconductor device shown in FIG. 40 at the time of off-operation.
Figure 43:
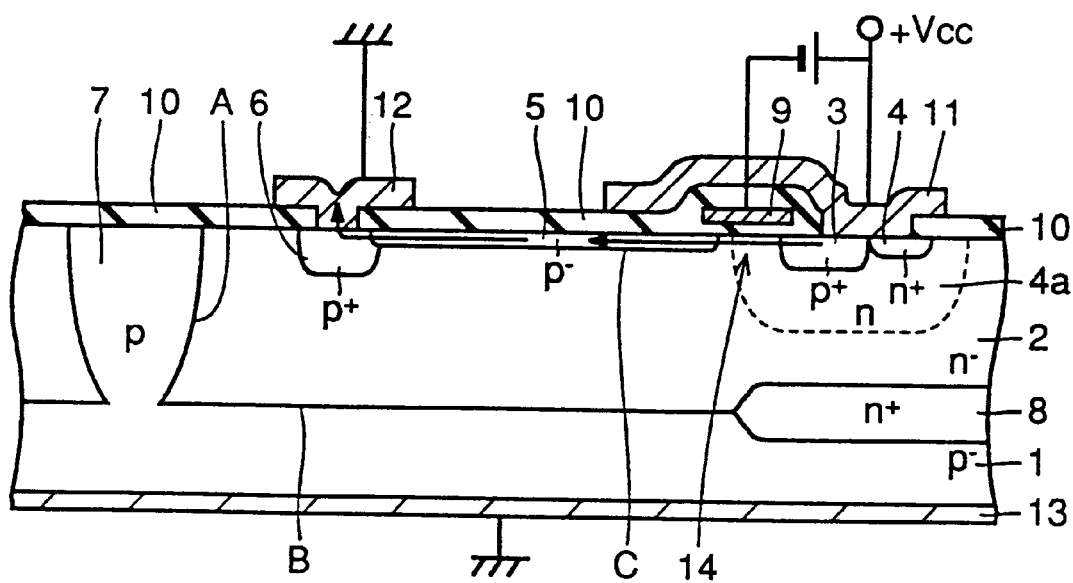
FIG. 43 shows an on-operation of the high withstand voltage semiconductor device shown in FIG. 40.
Figure 44:
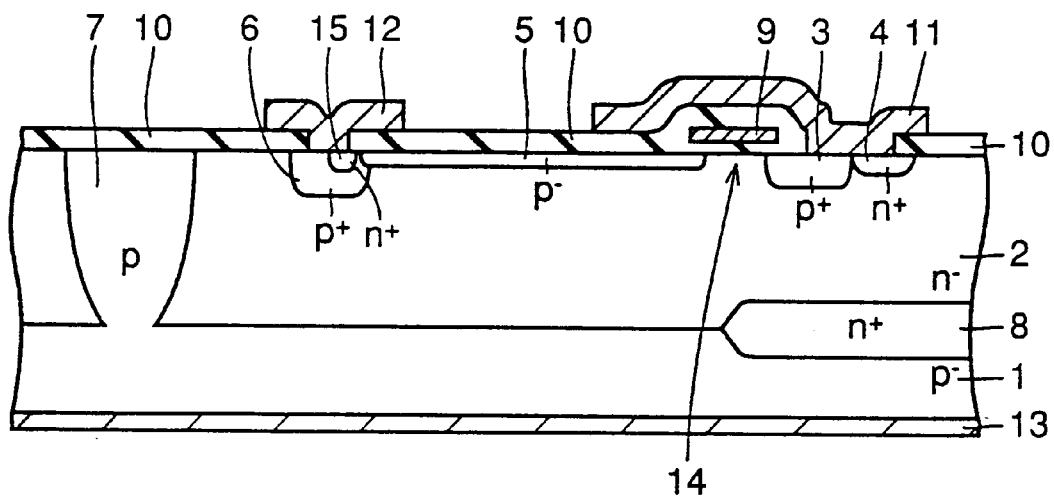
FIG. 44 is a partial cross sectional view of a second example of the conventional high withstand voltage semiconductor device.
Figure 45:
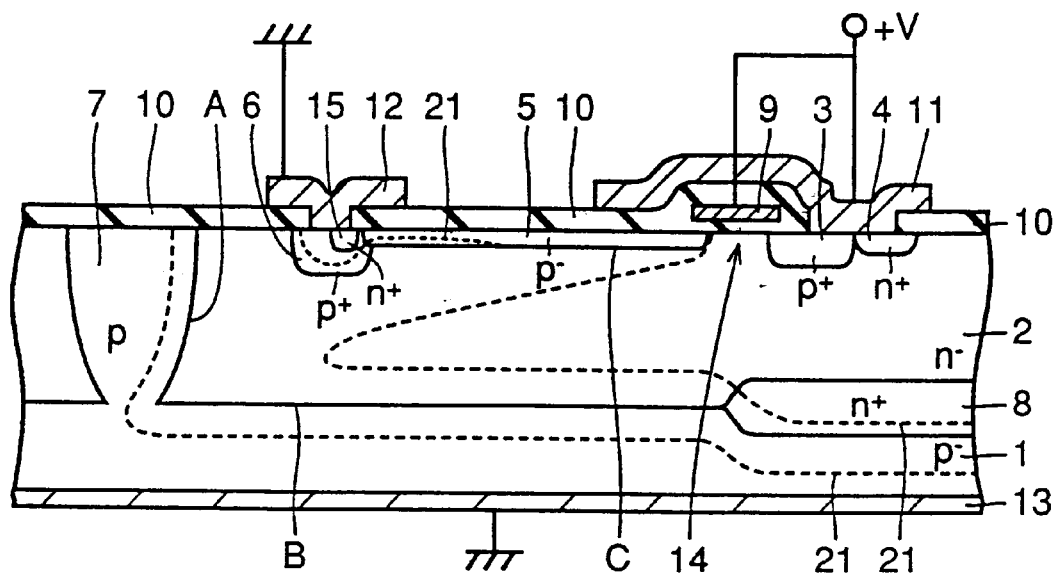
FIG. 45 shows a state of a depletion layer of the conventional high withstand voltage semiconductor device shown in FIG. 44 at the time of off-operation.
Figure 46:
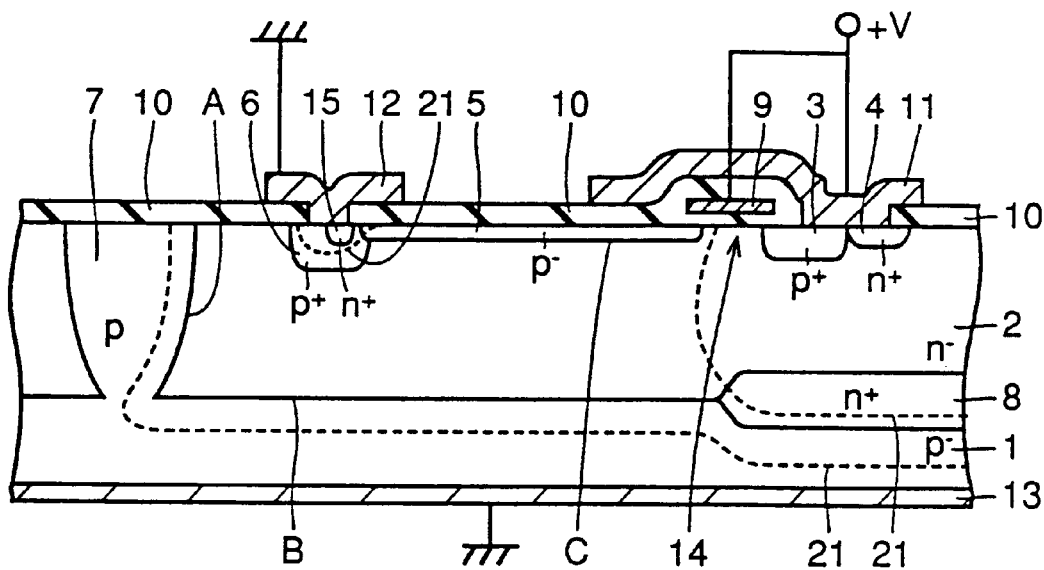
FIG. 46 shows a state of a depletion layer of the high withstand voltage semiconductor device shown in FIG. 44 at the time of off-operation.
Figure 47:
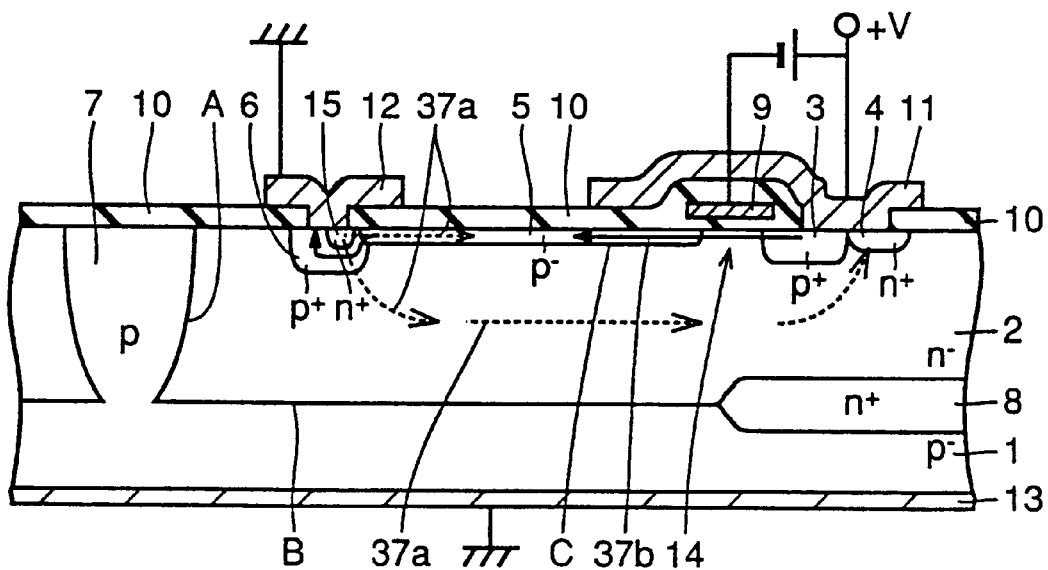
FIG. 47 shows an on-operation of the high withstand voltage semiconductor device shown in FIG. 44.

Then, as shown in FIG. 38, polysilicon layer 34a is formed through the same process as shown in the case of the first manufacturing method described above. Then, by heat treatment of polysilicon layer 34a, p⁺ diffusion region 36 is formed on a surface of p⁻ diffusion region 5e, as shown in FIG. 39. Through the process described above, polysilicon layer 34a and p⁻ diffusion region 5e shown in FIG. 32 are formed. Then, gate electrode 9, p⁺ diffusion region 3, 6, oxide film 10, source electrode 11, drain electrode 12 etc. are formed.

The first to fifth modifications described above can be applied not only to the first embodiment but also to all of the other p-channel devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a high withstand voltage semiconductor device, comprising the steps of:

forming a semiconductor layer of a first conductivity type on a main surface of a substrate;

forming an insulating layer on a surface of said semiconductor layer and patterning the insulating layer;

forming a conductive layer containing impurity of a second conductivity type having a relatively high concentration such that it covers said patterned insulating layer and a surface of said semiconductor layer;

forming at a surface of said semiconductor layer a plurality of first impurity diffusion regions containing impurity of the second conductivity type having a relatively low concentration at both sides of the patterned insulating layer spaced apart from one another by diffusing impurity of the second conductivity type from said conductive layer into said semiconductor layer;

patterning said conductive layer and electrically connecting said first impurity diffusion region by said conductive layer;

forming at a surface of said semiconductor layer a second impurity diffusion region of the second conductivity type spaced apart from a region for forming said first impurity diffusion regions;

forming a control electrode on a surface of said semiconductor layer positioned between said first and second impurity diffusion regions with an insulating layer interposed; and forming first and second main electrodes at a portion of a surface of said semiconductor layer.

\* \* \* \* \*